(12) United States Patent
Majumdar et al.

(10) Patent No.: US 6,208,041 B1
(45) Date of Patent: Mar. 27, 2001

(54) DRIVE CONTROL DEVICE, MODULE AND COMBINED MODULE

(75) Inventors: Gourab Majumdar; Khalid Hassan Hussein; Mitsutaka Iwasaki, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/244,175

(22) Filed: Feb. 4, 1999

(30) Foreign Application Priority Data

Sep. 11, 1998 (JP) .................................................. 10-257944

(51) Int. Cl.[7] .................................................. H03K 17/08
(52) U.S. Cl. .......................... 307/113; 307/130; 323/272; 340/825.89; 363/21
(58) Field of Search .................................. 307/113, 130, 307/53; 361/79, 93.2, 100, 115; 340/825.89; 323/272, 271, 285; 363/21; 327/107, 108

(56) References Cited

U.S. PATENT DOCUMENTS

| 3,633,046 | * | 1/1972 | Dewey ............................. 340/825.89 |
| 4,194,147 | * | 3/1980 | Payne et al. ............................. 307/53 |
| 4,912,621 | * | 3/1990 | Kobayashi et al. ..................... 363/21 |
| 5,319,295 | * | 6/1994 | Van Patten et al. .................. 318/606 |
| 5,338,994 | * | 8/1994 | Lezan et al. ............................. 307/86 |
| 5,689,170 | * | 11/1997 | Ishikawa ............................... 318/811 |
| 5,786,973 | | 7/1998 | Majumdar et al. .................. 361/100 |

FOREIGN PATENT DOCUMENTS

| 6-78549 | 3/1994 | (JP) . |
| 7-163137 | 6/1995 | (JP) . |
| 7-177727 | 7/1995 | (JP) . |
| 8-19246 | 1/1996 | (JP) . |
| 8-213890 | 8/1996 | (JP) . |

* cited by examiner

Primary Examiner—Albert W. Paladini
(74) Attorney, Agent, or Firm—Oblon, Spivak, McClelland, Maier & Neustadt, P.C.

(57) ABSTRACT

Current sense voltages ($V_{CS1}$~$V_{CSn}$), which are the detected values of n ($\geq 2$) IGBTs connected in parallel, are converted into digital form, and thereafter, are subjected to an operation processing. After the current sense voltages ($V_{CS1}$~$V_{CSn}$) are converted into collector currents ($I_1$~$I_n$) by use of constants ($G_1$~$G_n$ and $V_{OFFSET1}$~$V_{OFFSETn}$)(step 103), current deviations ($\Delta I_1$~$\Delta I_n$) respectively defined as differences of the collector currents ($I_1$~$I_n$) from the average ($I_{AVG}$) thereof are calculated (step 104, 105). Drive control voltages ($V_{D1}$~$V_{Dn}$) are renewed by changes ($\Delta V_{D1}$~$\Delta V_{Dn}$) which are respectively obtained by multiplying the current deviations ($\Delta I_1$~$\Delta I_n$) by factors ($K_{ij}$)(step 106, 107). The drive control voltage ($V_{D1}$~$V_{Dn}$) are converted into analogue form, and thereafter, supplied to n IGBTs as their gate voltages ($V_{GE}$). The constants ($G_1$~$G_n$, $V_{OFFSET1}$~$V_{OFFSETn}$, and $K_{ij}$) are prepared individually for respective n switching elements. As a result, current imbalance of plural switching elements connected in parallel is eliminated in high precision.

14 Claims, 17 Drawing Sheets

DRIVE CONTROL DEVICE, MODULE AND COMBINED MODULE

BACKGROUND OF THE INVENTION

1. Field of the Invention

The present invention relates to a drive control device for eliminating imbalance in main currents flowing across switching elements connected in parallel with one another, a module into which the switching element is integrated, and combined module having the switching elements connected in parallel which are the best suited for being applied to power conversion devices e.g. an inverter. In particular, the invention relates to an improvement of the same for precisely controlling the switching elements to eliminate the current imbalance.

2. Description of the Background Art

A power switching element e.g. a power IGBT, a power transistor, a power MOS transistor, and so on is widely utilized for a constituent element of a power conversion device e.g. an inverter, a chopper, and a converter. In an applied device represented by these power conversion devices, it is usual that plural power switching elements designed equally with one another are prepared and connected in parallel with one another especially when high rated current is required.

Main currents have to be kept equal with one another among the plural power switching elements connected in parallel because a burden is concentrated onto a particular power switching element and thereby a reliability of the applied device is degraded if the equality in the main currents fails. It is, however, usual that there are inequalities in electric characteristics among the plural power switching elements even if these elements are designed equally with one another. These inequalities arise from parasitic errors inevitably generated during manufacturing processes of the elements.

Inequality in saturation voltages across pairs of the main electrodes (e.g. collector-emitter saturation voltages $V_{CE(sat)}$ for IGBTs or bipolar transistors) is the most important of various inequalities among the plural power switching elements connected in parallel. Because the voltages across the respective pairs of the main electrodes of the elements connected in parallel are dominated by an element having the highest saturation voltage, and therefore, an element having lower saturation voltage shares larger current so as to raise up its saturation voltage.

Since the plural power switching elements connected in parallel usually share currents unequally as described above, an element across which larger current flows suffers higher current stress. As a result, a reliability of whole the elements connected in parallel or a reliability of the applied device is degraded.

The inequality in the main currents (i.e. current imbalance) is more serious problem for power switching elements having negative temperature coefficient. Because a larger main current flowing across the element having the negative temperature coefficient brings a rise in the temperature of the element so that the saturation voltage of the element decreases. The decrease in the saturation voltage causes the main current to flow further more largely. This vicious circle is repeated and thereby an excessive load is brought onto a particular element. As a result, the reliability of the applied device is degraded.

Two approaches are known as conventional techniques aiming at elimination of the inequality (i.e. imbalance) in the main currents respectively flowing across the power switching elements connected in parallel. The first one is a passive approach. In this approach, those power switching elements having identical or very similar electric characteristics are chosen as the elements to be connected in parallel. That is, power switching elements are subjected to such a screening as to minimize the deviations in characteristics thereof.

The second one is an active approach. In this approach, as disclosed in Japanese Patent Laying Open Gazette No. 8-213890, the main currents are so controlled by feedback control technique that inequality thereof is suppressed. More specifically, the main currents respectively flowing across the power switching elements are detected by current detection circuits and such control signals are transmitted to respective control electrodes of the power switching elements as to reduce the inequality in the detected main currents. This feedback control is performed by a control circuit formed of analogue circuit elements.

The first approach restricts the power switching elements to be employed for the device, i.e. produces those elements not to be used as the result of the screening. Accordingly, wastes are disadvantageously generated during the manufacturing processes of the elements. Further, the problem of the current imbalance is not completely solved even if the screening is carried out because it is usually not easy to find out power switching elements having identical electric characteristics.

On the other hand, the second approach performs the feedback control for equalizing the main currents; therefore, it does not require screening the power switching elements to make their electric characteristics uniform. However, since the control circuit for carrying out the feedback control is formed as an analogue circuit, it is disadvantageously hard to eliminate the current imbalance in high precision. Especially, the approach is disadvantageous in that it is hard to flexibly exclude the influence of the inequalities in various characteristics and thereby eliminate the current imbalance.

For example, inevitable inequality is usually generated during the manufacturing processes also in the characteristics of circuit elements forming the plural current detection circuits which are connected with the plural power switching elements respectively. This inequality gives rise to incorrect detection of inequality in the main currents of the power switching elements connected in parallel. It is hard for the analogue circuit to prevent the influence of the incorrect detection of the main currents. Therefore, the second approach in some cases happens to cause incorrect feedback control which generates the problem of inequality in the main currents rather than solves the same.

Further, in general there are inequalities not only in the characteristics of the current detection circuits but also in the transfer characteristics of the power switching elements themselves (e.g. respective relations between gate voltages $V_{GE}$ and collector currents $I_C$ in IGBTs), the characteristics of drive circuits of the power switching elements, the laying-out of wires which connect the plural power switching elements and the control circuit, the characteristics of circuit elements forming the control circuit, and so on. It is disadvantageously hard for the control circuit formed as an analogue circuit to implement a flexible and highly precise control which eliminates the current imbalance taking account of these inequalities as well.

SUMMARY OF THE INVENTION

A first aspect of the present invention is directed to a drive control device for being connected with n switching elements, where n is at least 2, which are connected in parallel with one another and for repeatedly renewing n control signals which control n main currents flowing across the n switching elements respectively on a basis of n current detection signals representing detected values of the n main currents and thereby supplying the n switching elements with the n control signals.

The drive control device comprises: an A/D conversion unit for converting the n current detection signals from analogue form to digital form; an operation unit for executing digital operation processing on a basis of the n current detection signals having digital form to thereby calculate the n control signals; and a D/A conversion unit for converting the n control signals calculated by the operation unit from digital form to analogue form.

The operation unit comprises: a current calculation unit for converting the n current detection signals having digital form into the n main currents respectively; a current deviation calculation unit for calculating an average of the n main currents converted into by the current calculation unit and thereby calculating n current deviations which are respectively differences of the n main currents from the average; and a control signal calculating unit for renewing the n control signals so as to reduce each of the n current deviations.

According to a second aspect, in the drive control device of the first aspect, the drive control device further comprises: a calibration data storing unit for storing a calibration data which individually defines respective relations between the n current detection signals and the n main currents depending on the n switching elements, and the current calculation unit converts the n current detection signals into the n main currents respectively on a basis of the calibration data stored by the calibration data storing unit.

According to a third aspect, in the drive control device of the second aspect, the operation unit further comprises: a current calibration unit for creating the calibration data on a basis of k current detection signals, where k is at least 1, responding to given k main currents for each of the n switching elements and thereby storing the created calibration data into the calibration data storing unit.

According to a fourth aspect, in the drive control device of any one of the first to third aspects, the control signal calculation unit so renews the n control signals as to change the same by an amount respectively proportional to the n current deviations.

According to a fifth aspect, in the drive control device of the fourth aspect, the drive control device further comprises: a conversion data storing unit for storing a conversion data which individually defines respective proportional relations between the n current deviations and the n control signals depending on the n switching elements, and the control signal calculation unit so renews the n control signals as to change the same by an amount respectively proportional to the n current deviations on a basis of the conversion data stored by the conversion data storing unit.

According to a sixth aspect, in the drive control device of the fifth aspect, the operation unit further comprises: a conversion data calculation unit for outputting m control signals, where m is at least 2, to each of the n switching elements under an application of a common saturation voltage to the n switching elements, creating the conversion data for each of the n switching elements as change rate in main current versus control signal on a basis of the m control signals and m main currents obtained by the current calculation unit as a result of an output of the m control signals, and thereby storing the created conversion data into the conversion data storing unit.

According to a seventh aspect, in the drive control device of the sixth aspect, the conversion data storing unit is storing the conversion data which is created by the conversion data calculation unit under application of a maximum value of saturation voltages applicable to the n switching elements during operation.

According to an eighth aspect, in the drive control device of any one of the first to seventh aspects, the operation unit has a CPU for operating in accordance with a program and a memory storing the program, and the units provided in the operation unit are equivalently formed of the CPU and the memory.

A ninth aspect of the present invention is directed to a module. The module comprises: the drive control device of any one of the first to eighth aspects; a main element as one of the n switching elements; and a current detection unit for detecting a main current flowing across the main element and thereby outputting a current detection signal. The drive control device receives the current detection signal outputted by the current detection unit as one of the n current detection signals, and supplies the main element with one of the n control signals.

A tenth aspect of the present invention is directed to a combined module. The combined module comprises: the drive control device of any one of the first to eighth aspects; the n switching elements; and n current detection units for detecting the n main currents to thereby respectively obtain the n current detection signals and supplying the drive control device with the n current detection signals. The drive control device supplies the n switching elements with the n control signals respectively.

According to an eleventh aspect, in the combined module of the tenth aspect, the combined module further comprises n cases, the n switching elements and the n current detection units are integrated into the n cases respectively, and any one of the n current detection units detects a main current of one of the n switching elements which is integrated into one case with the same.

According to a twelfth aspect, in the combined module of the eleventh aspect, the drive control device is also integrated into one of the n cases.

In the device of the first aspect, the control signals are repeatedly renewed so as to reduce the current deviations of the plural (i.e. n) switching elements connected in parallel with one another on the basis of digital signal processing. Therefore, current imbalance among the plural switching elements, especially that arising from inequality in saturation voltage can readily and precisely be eliminated. Accordingly, the current imbalance is eliminated not only for switching elements having positive temperature coefficient but also for those having negative temperature coefficient so that any one of the connected plural switching elements is prevented from suffering the concentration of an excessive load.

In the device of the second aspect, the plural current detection signals are converted into the plural main currents on the basis of the calibration data which individually defines respective relations between the plural current detection signals and the plural main currents depending on the plural switching elements. Therefore, errors arising from inequality in performance of detecting the main currents, that of wires which inter-connect the switching elements and the drive control devices, and so on are so eliminated as to implement further precise control.

In the device of the third aspect, since the current calibration unit is provided, the preparation of the calibration data can readily be performed. In addition, the calibration data can be prepared on user side individually for respective plural switching elements which are to be connected and used by the user.

In the device of the fourth aspect, since the control signals are renewed so as to change by an amount respectively proportional to the current deviations, the elimination of the current deviations i.e. that of the current imbalance can be implemented by simple operation.

In the device of the fifth aspect, the control signals are renewed by use of the conversion data which individually defines respective proportional relations between the plural current deviations and the plural control signals depending on the plural switching elements. Hence, errors arising from inequality in transfer characteristic of the plural switching elements, inequality in performance of wires which interconnect the switching elements and the drive control devices, and so on are so eliminated as to implement further precise control.

In the device of the sixth aspect, since the conversion data calculation unit is provided, the preparation of the conversion data can readily be performed. In addition, the conversion data can be prepared on user side individually for respective plural switching elements which are to be connected and used by the user.

In the device of the seventh aspect, the control signals are renewed on the basis of the conversion data which is created by the conversion data calculation unit under application of the maximum value of saturation voltages applicable to the n switching elements during operation. Therefore, such a control is implemented as to suppress fluctuation in the current deviations during operation and to converge the current deviations into zero smoothly.

In the device of the eighth aspect, since the operation unit is implemented equivalently by the CPU and the memory which is storing the program, control flexibly responding to various causes of errors can readily be performed without any complicated circuits used.

In the module of the ninth aspect, the drive control device is provided together with the switching element and the current detection unit. Therefore, a useful combined module can readily be assembled by connecting in parallel the module and a conventional module which does not have the drive control device. That is, the module can easily be handled for utilization.

In the combined module of the tenth aspect, the drive control device is provided together with the plural switching elements and the plural current detection units. Therefore, the combined module precisely eliminates the current imbalance among the plural switching elements to thereby prevent the plural switching elements from suffering unequal loads.

In the combined module of the eleventh aspect, the plural switching elements and the plural current detection units are integrated into the plural cases so as to respectively form modules. Therefore, various combined modules having various number n of the modules can freely be assembled by using single or few types of n modules and inter-connecting them with wires. As a result, the manufacturing cost is advantageously reduced.

In the combined module of the twelfth aspect, the drive control device is also integrated into one of the plural cases so as to form a module having a drive control device. Therefore, the combined module can easily be assembled by using the module which has the drive control device and the module which does not have the same and inter-connecting them in parallel with wires. Since the drive control device and the modules do not have to be handled as separated parts, work for assembling the combined module is advantageously facilitated.

Accordingly, it is an object of the present invention to obtain a drive control device which precisely eliminates the current imbalance among the switching elements connected in parallel, especially implements highly flexible control also taking account of inequality in various characteristics including those of the current detection circuit, and further to provide a module into which the drive control device and one of the switching elements are integrated and a combined module which has the drive control device and the switching elements.

These and other objects, features, aspects and advantages of the present invention will become more apparent from the following detailed description of the present invention when taken in conjunction with the accompanying drawings.

DESCRIPTION OF THE PREFERRED EMBODIMENTS

<1. First Preferred Embodiment>

First, a drive control device, a module, and a combined module according to a first preferred embodiment of the present invention will be described.

<1-1. Outline of Structure>

Figure 1:
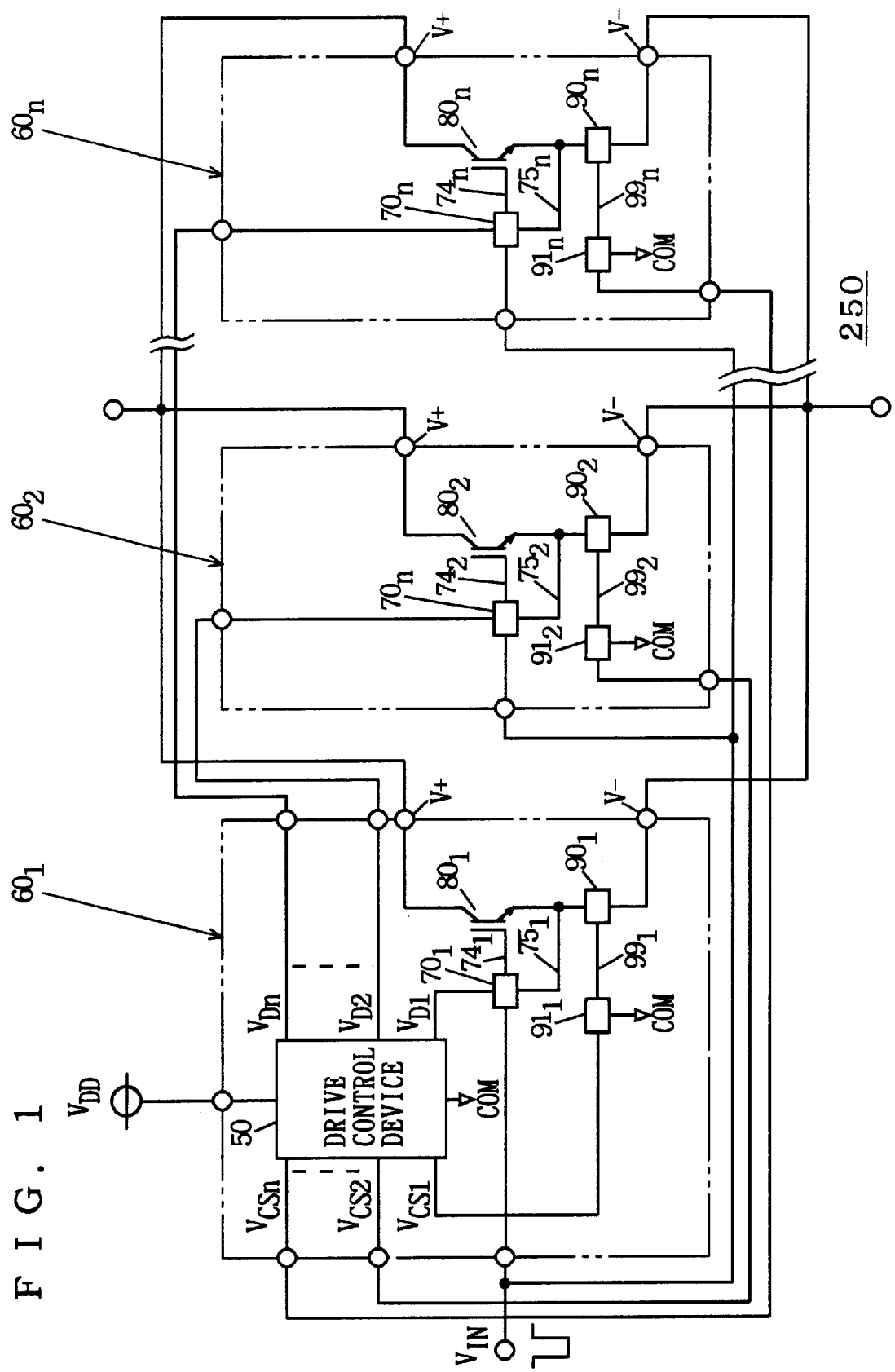
FIG. 1 is a block diagram of a combined module according to a first preferred embodiment of the present invention.

FIG. 1 is a block diagram showing whole structure of the combined module of the first preferred embodiment. This combined module 250 comprises modules $60_1$–$60_n$ ($n \geq 2$). The modules $60_1$–$60_n$ are respectively provided with switching elements $80_1$–$80_n$, current detection units $90_1$–$90_n$, drive units $70_1$–$70_n$, and current detection signal amplifying units $91_1$–$91_n$.

The modules $60_1$–$60_n$ include a single main module $60_1$ and at least one of sub-modules $60_2$–$60_n$. The main module $60_1$ further comprises a drive control device 50. Thus, "a module" means, in the present specification, a device into which plural elements including a switching element, which switches a main current flowing across the same, and a peripheral circuit connected with the switching element are integrated so as to be handled as a single device. "A combined module" means a device which is formed by connecting plural modules.

Although not shown in FIG. 1, preferably in each of the modules $60_1$–$60_n$, plural circuit elements including the switching element 80 are disposed on a circuit board contained in a single case, and those plural external terminals are connected with the circuit board end portions of which are exposed out of the case. Each of the modules $60_1$–$60_n$ are, thereby, capable of being handled as a single device.

The connection among the modules $60_1$–$60_n$ and the connection between the modules $60_1$–$60_n$ and an external device are implemented by connecting wires with the external terminals exposed from a case of each of the modules $60_1$–$60_n$. In FIG. 1, blank circles depicted on square frames respectively representing the modules $60_1$–$60_n$ show the external terminals.

Each of the switching elements $80_1$–$80_n$ is generally a semiconductor element which controls a main current flowing across the same through a pair of main electrodes in response to a signal inputted to a control electrode, while it is preferably a power switching element e.g. a power IGBT, a power bipolar transistor, and a power MOSFET. Above all, the power IGBT advantageously has low saturation voltage $V_{CE(sat)}$ which is defined as a voltage between the pair of the main electrodes in a conducting (ON) state and is voltage control type in which the control is readily implemented. Therefore, each of the switching elements $80_1$–$80_n$ will be a power IGBT in the following description.

Pairs of the main electrodes i.e. collector electrodes and emitter electrodes are connected with one another among the switching elements $80_1$–$80_n$ which are power IGBTs. More specifically, the n collector electrodes are connected with one another through load terminals $V_+$ respectively provided in the modules $60_1$–$60_n$. The n emitter electrodes are connected with one another through load terminals $V_-$ respectively provided in the modules $60_1$–$60_n$. The load terminals $V_+$ and $V_-$ are those for connecting an external power source and an external load with the modules $60_1$–$60_n$. In this manner, the switching elements $80_1$–$80_n$ are connected in parallel with one another.

The modules $60_1$–$60_n$ receive an input signal $V_{IN}$ as a voltage signal in common from an exterior. The switching elements $80_1$–$80_n$ conduct (turn on) and cut-off (turn off) simultaneously with one another in response to the input signal $V_{IN}$. Thus, the switching elements $80_1$–$80_n$ operate as a whole as if they were a single power IGBT.

Control electrodes i.e. gate electrodes of the switching elements $80_1$–$80_n$ are connected with one another respectively through the drive units $70_1$–$70_n$. Therefore, the input signal $V_{IN}$ is inputted to the gate electrodes of the switching elements $80_1$–$80_n$ after undergoing a certain conversion through the drive units $70_1$–$70_n$. The drive units $70_1$–$70_n$ adjust gate voltages (i.e. voltages between the gate electrodes and the respective emitter electrodes) respectively on the basis of drive control voltages (control signals) $V_{D1}$–$V_{Dn}$ transmitted from the drive control device 50 when converting the input signal $V_{IN}$.

The drive control device 50 so calculates the drive control voltages $V_{D1}$–$V_{Dn}$ on the basis of current sense voltages (current detection signals) $V_{CS1}$–$V_{CSn}$ which respectively represent the main currents (i.e. collector currents) of the switching elements $80_1$–$80_n$, as to reduce inequality in the collector currents. Thus, the drive control device 50 is such a device for performing a feedback control on the main currents of the switching elements $80_1$–$80_n$ as to eliminate the current imbalance among the switching elements $80_1$–$80_n$ connected in parallel. As will be mentioned later, the drive control device 50 executes the feedback control through digital signal processing.

The collector currents of the switching elements $80_1$–$80_n$ are detected respectively by the current detection units $90_1$–$90_n$ which are respectively connected with the emitter electrodes of the switching elements $80_1$–$80_n$. As a result, the current sense voltages $V_{CS1}$–$V_{CSn}$ are outputted as the detected signals of the collector currents from the current detection unit $90_1$–$90_n$. The current sense voltages $V_{CS1}$–$V_{CSn}$ are respectively amplified by the current signal amplifying units $91_1$–$90_n$ and thereafter transmitted to the drive control device 50.

The external terminals provided in each of the modules $60_1$–$60_n$ include a positive power source terminal $V_{DD}$ and a negative source terminal COM for receiving supplied source voltage. The drive control device 50 and the current detection signal amplifying unit $91_1$–$91_n$ are supplied with the source voltage through the source terminals $V_{DD}$ and COM. Each of the modules $60_1$–$60_n$ is further provided with wires for inter-connecting elements included in the same with one another.

For example, the wires $74_1$–$74_n$ respectively inter-connect the drive units $70_1$–$70_n$ with the gate electrodes of the switching elements $80_1$–$80_n$. The wires $75_1$–$75_n$ respectively inter-connect the drive units $70_1$–$70_n$ with the emitter electrodes of the switching elements $80_1$–$80_n$. The wires $99_1$–$99_n$ respectively inter-connect the current detection units $90_1$–$90_n$ with the current detection signal amplifying units $91_1$–$91_n$.

<1-2. Structure of Each Element>

Figure 2:
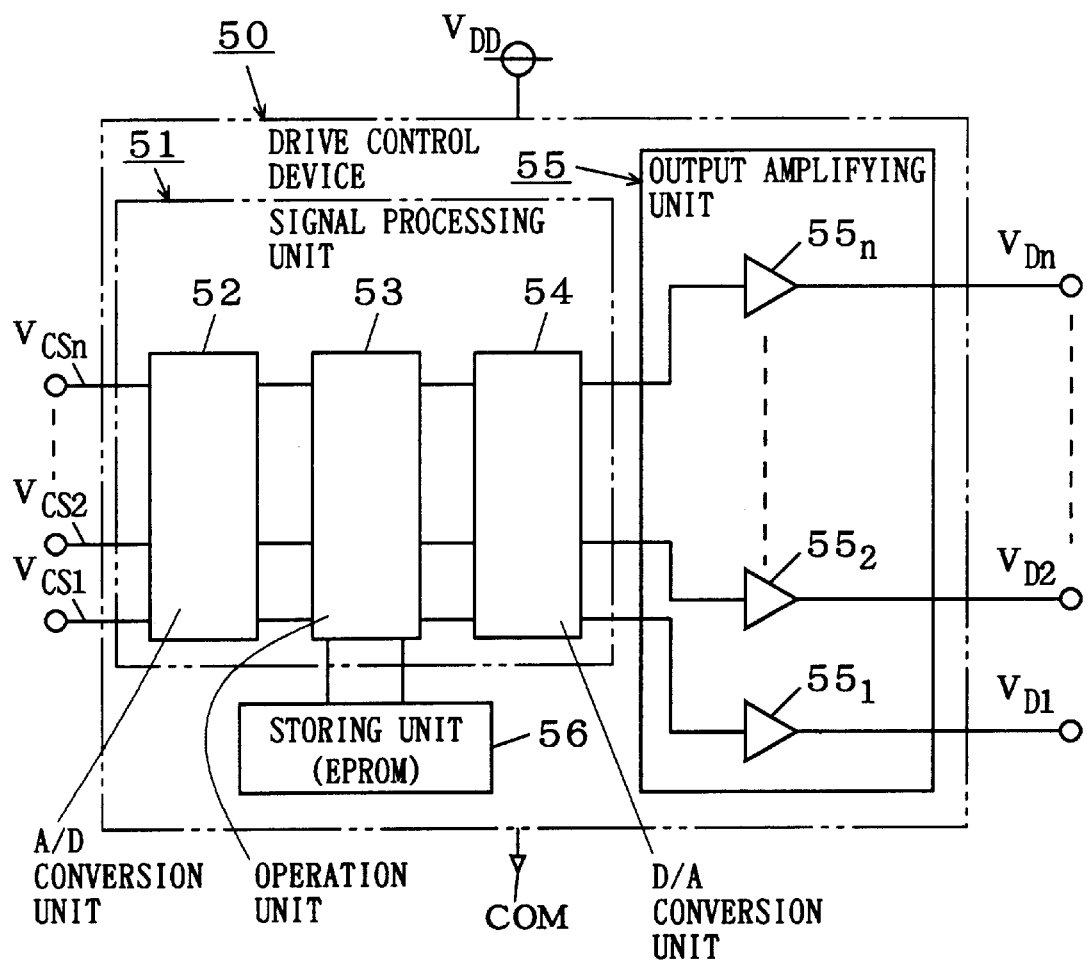
FIG. 2 is a block diagram of a drive control device of the first preferred embodiment.

FIG. 2 is a block diagram showing an internal structure of the drive control device 50. The drive control device 50 is provided with a signal processing unit 51, a storing unit 56, and an output amplifying unit 55. The signal processing unit 51 is provided with an A/D conversion unit 52, an operation unit 53, and a D/A conversion unit 54. The output amplifying unit 55 has buffers $55_1 \sim 55_n$.

The storing unit 56 preferably comprises a semiconductor memory capable of holding stored data without a backing-up voltage source, e.g. a static RAM backed-up by a battery or a ROM. An EPROM is especially desirable because of capability of easy writing and needlessness of a battery for backing-up. Well known A/D converter and D/A converter are respectively useful for the A/D conversion unit 52 and D/A conversion unit 54.

The signal processing unit 51 receives the current sense voltages $V_{CS1} \sim V_{CSn}$ and performs processing on these signals to thereby calculate the drive control voltages $V_{D1} \sim V_{Dn}$. The current sense voltages $V_{CS1} \sim V_{CSn}$ having analogue form inputted to the signal processing unit 51 are converted into those having digital form by the A/D conversion unit 52. The operation unit 53 executes a predetermined digital operation processing on the current sense voltages $V_{CS1} \sim V_{CSn}$ having digital form to thereby calculate the drive control voltages $V_{D1} \sim V_{Dn}$ having digital form. The operation unit 53 accesses the storing unit 56 during the operation processing. The drive control voltages $V_{D1} \sim V_{Dn}$ having digital form are converted into those having analogue form by the D/A conversion unit 54.

The output amplifying unit 55 amplifies the drive control voltages $V_{D1} \sim V_{Dn}$ calculated by the signal processing unit 51. Specifically, the drive control voltages $V_{D1} \sim V_{Dn}$ having analogue form inputted to the output amplifying unit 55 are respectively amplified by the buffer $55_1 \sim 55_n$. The amplified drive control voltages $V_{D1} \sim V_{Dn}$ are respectively transmitted to the drive units $70_1 \sim 70_n$.

Figure 3:
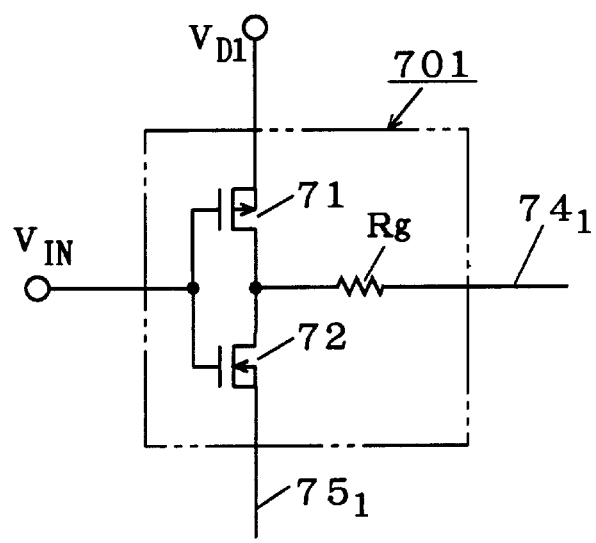
FIG. 3 is a block diagram of a drive unit of the first preferred embodiment.

FIG. 3 is a circuit diagram showing internal structure of the drive unit $70_I$ as a representative of the drive units $70_1 \sim 70_n$. Any one of the other drive units $70_{2 \sim 70n}$ is so formed as to be identical with the drive unit $70_I$. The drive unit $70_I$ comprises an inverter formed of a MOSFET 71 of p-channel type and a MOSFET 72 of n-channel type which are connected in series with each other. The source electrode of the MOSFET 72 is connected with the wire $75_I$. The drive control voltage $V_{DI}$ is inputted to the source electrode of the MOSFET 71. The input signal $V_{IN}$ is inputted to the input of the inverter i.e. the common gate electrode of the MOSFET 71 and 72. The output of the inverter i.e. the common drain electrode of the MOSFET 71 and 72 is connected with the wire $74_I$ through a resistance element Rg.

Accordingly, the input signal $V_{IN}$ inputted to the drive unit $70_I$ is inverted in signal level (which is high or low level) and thereafter outputted to the wire $74_I$. Besides, since the drive control voltage $V_{DI}$ is supplied to the drive unit $70_I$ as a source voltage of the inverter, a voltage of high level signal outputted to the wire $74_I$ coincides with the drive control voltage $V_{DI}$.

The signal outputted to the wire $74_I$ is transmitted to the switching element $80_I$ as its gate voltage (control signal) $V_{GE}$. When the high and low level signals are outputted, the switching element $80_I$ turns on and turns off respectively. Thus, the gate voltage $V_{GE}$ at a level, which makes the switching element $80_I$ turn on, is consistent with the drive control voltage $V_{DI}$.

As a result, a collector current flowing across the switching element $80_I$ at its ON state (conducting state) is adjusted by the drive control voltage $V_{DI}$. The collector current increases with an increase in the drive control voltage $V_{DI}$. Thus, the drive control device 50 adjusts the gate voltages of the switching elements $80_1 \sim 80_n$ through the drive units $70_1 \sim 70_n$ to thereby control the collector currents of the switching elements $80_1 \sim 80_n$.

Figure 4:
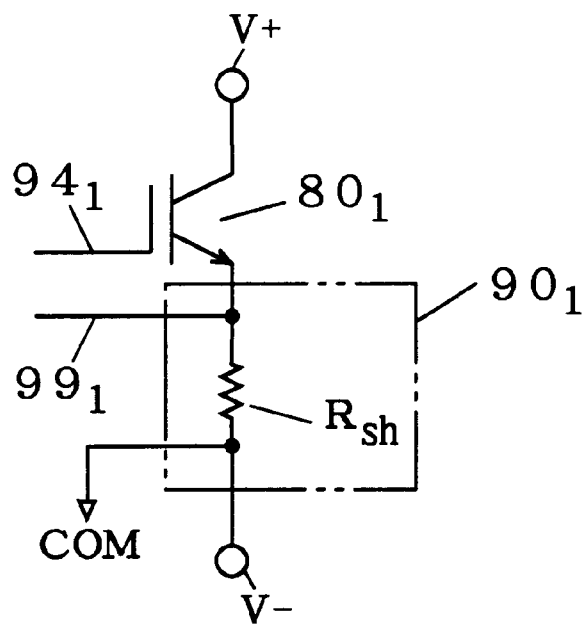
FIG. 4 is a block diagram of an example of a current detection unit of the first preferred embodiment.
Figure 5:
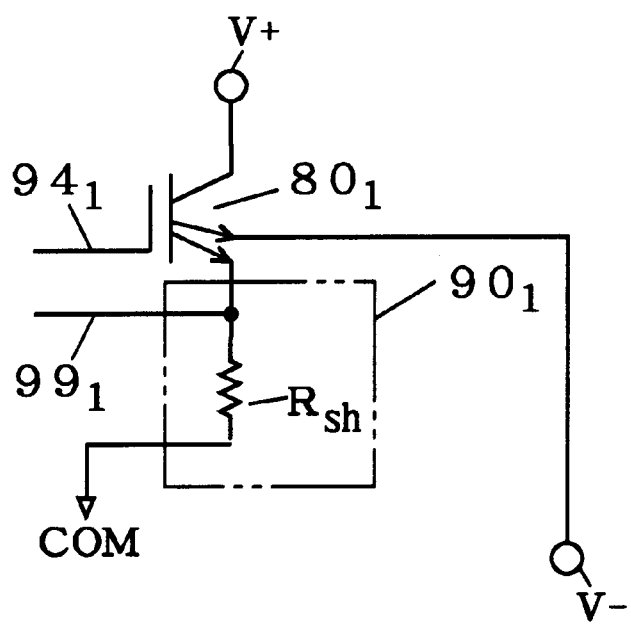
FIG. 5 is a block diagram of another example of the current detection unit of the first preferred embodiment.
Figure 6:
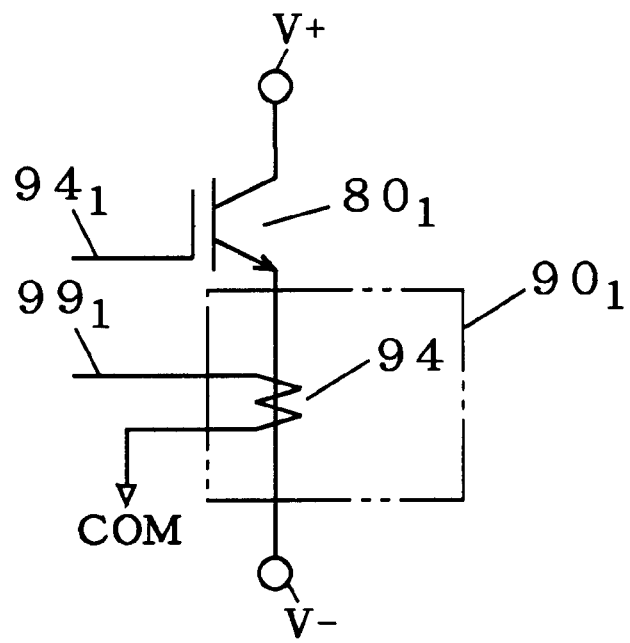
FIG. 6 is a block diagram of still another example of the current detection unit of the first preferred embodiment.

FIGS. 4 to 6 are circuit diagrams showing three preferable examples of internal structure of the current detection units $90_1 \sim 90_n$. These figures show the current detection unit $90_I$ as a representative of the current detection units $90_1 \sim 90_I$. Any one of the other current detection units $90_2 \sim 90_n$ is so formed as to be identical with the current detection unit $90_I$.

The unit shown in FIG. 4 comprises a resistance element Rsh. This resistance element Rsh is interposed between the emitter electrode of the switching element $80_I$ and the negative load terminal $V_-$. Hence, the collector current of the switching element $80_I$ flows across the resistance element Rsh. Accordingly, a voltage drop proportional to the collector current is generated across the resistance element Rsh. The voltage drop is transmitted as the current sense voltage $V_{CSI}$ through the wire $99_I$ which is connected with a connection point between the emitter electrode and the resistance element Rsh.

The current detection unit $90_I$ shown in FIG. 5 also comprises the resistance element Rsh. The switching element $80_I$ is, however, an element of multi-emitter type; i.e. it has an emitter electrode, through which major part of the collector current flows, and a sense electrode through which slight part of the collector current flows. Sense current flowing through the sense electrode is proportional to the collector current. The emitter electrode is connected with the load terminal $V_-$.

The resistance element Rsh is interposed between the sense electrode and a wire connected with the negative source terminal COM. The sense current of the switching element $80_I$, therefore, flows across the resistance element Rsh. Accordingly, a voltage drop proportional to the collector current of the switching element $80_I$ is generated across the resistance element Rsh. This voltage drop is transmitted as the current sense voltage $V_{CSI}$ through the wire $99_I$ connected with a connection point between the sense electrode and the resistance element Rsh.

The current detection unit $90_I$ shown in FIG. 6 comprises a Hall element 94. The Hall element 94 detects a current flowing through a wire which connects the emitter electrode of the switching element $80_I$ and the load terminal $V_-$ to thereby output a voltage signal proportional to the current as the current sense voltage $V_{CSI}$. The current sense voltage $V_{CSI}$ is transmitted through the wire $99_I$ connected with the Hall element 94.

Since the Hall element 94 is used, the example shown in FIG. 6 advantageously provides the high precision in current detection. On the other hand, the examples shown in FIG. 4 and 5 provide advantages that manufacturing cost for the current detection unit $90_I$ can be cut down and the size of the same can be reduced. Especially, the example shown in FIG. 5 is advantageous in that a current flowing across the resistance element Rsh is so slight that the power loss is low and the resistance element Rsh can be formed as a low power element.

Figure 7:
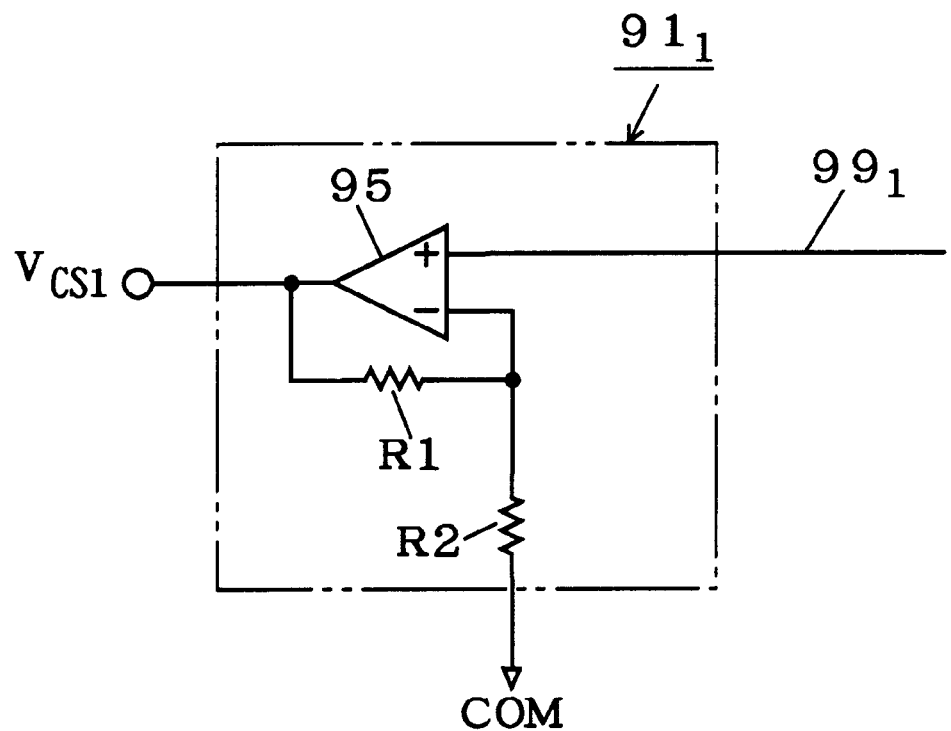
FIG. 7 is a block diagram of a current detection signal amplifying unit of the first preferred embodiment.

FIG. 7 is a circuit diagram showing an internal structure of the current detection signal amplifying unit $91_I$ as a representative of the current detection signal amplifying units $91_1 \sim 91_n$. Any one of the other current detection signal amplifying units $91_2 \sim 91_n$ is so formed as to be identical with the current detection signal amplifying unit $91_I$. The current detection signal amplifying unit $91_I$ comprises an operational amplifier 95 and resistance elements R1, R2. The resistance element R1 is interposed between an output and a reverse input of the operational amplifier 95 so as to form a negative feedback loop. The resistance element R2 is interposed between the reverse input and a wire connected with the negative source terminal COM.

Thus, the current detection signal amplifying unit $91_l$ is formed as a well known non-inverting amplifier using an operational amplifier. The current sense voltage $V_{CSl}$ outputted from the current detection unit $90_l$ is transmitted to a non-reverse input of the operational amplifier 95 through the wire $99_l$. As a result, amplified current sense voltage $V_{CSl}$ is outputted from the output of the operational amplifier 95. The amplified current sense voltage $V_{CSl}$ is transmitted to the drive control device 50.

<1-3. Outline of Processing in Operation Unit>

Figure 8:
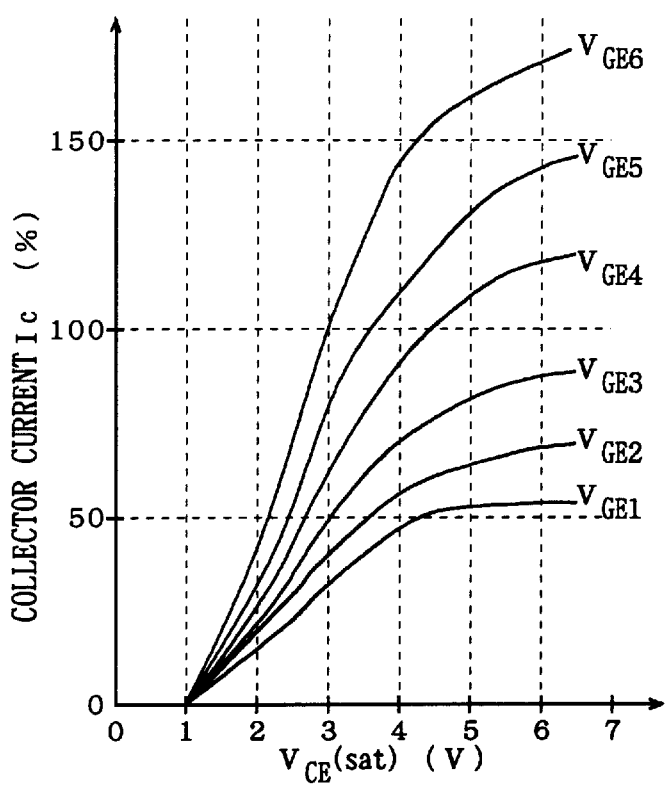
FIG. 8 is a graph showing an example of output characteristic of an IGBT.

The outline of operation processing executed by the operation unit 53 will be described. FIG. 8 is a graph showing an output characteristic of an IGBT used for each of the switching elements $80_l$-$80_n$. Specifically, FIG. 8 shows relation between a collector current $I_C$ and a saturation voltage $V_{CE(sat)}$ under various gate voltages $V_{GE(i)}$ (where i=1~6 and $V_{GE(i+1)} > V_{GE(i)}$).

As shown in FIG. 8, the saturation voltage $V_{CE(sat)}$ varies approximately in proportion to the collector current $I_C$ and the gate voltage $V_{GE}$. Accordingly, when the switching elements $80_l$-$80_n$ have unequal saturation voltages $V_{CE(sat)}$, the operation unit 53 reduces a drive control voltage for a switching element which has such a lower saturation voltage $V_{CE(sat)}$ that larger collector current $I_C$ flows. On the contrary, the operation unit 53 raises up a drive control voltage for a switching element which has such a higher saturation voltage $V_{CE(sat)}$ that smaller collector current $I_C$ flows. The operation unit 53, thereby, eliminates the current imbalance among the switching elements connected in parallel.

Figure 9:
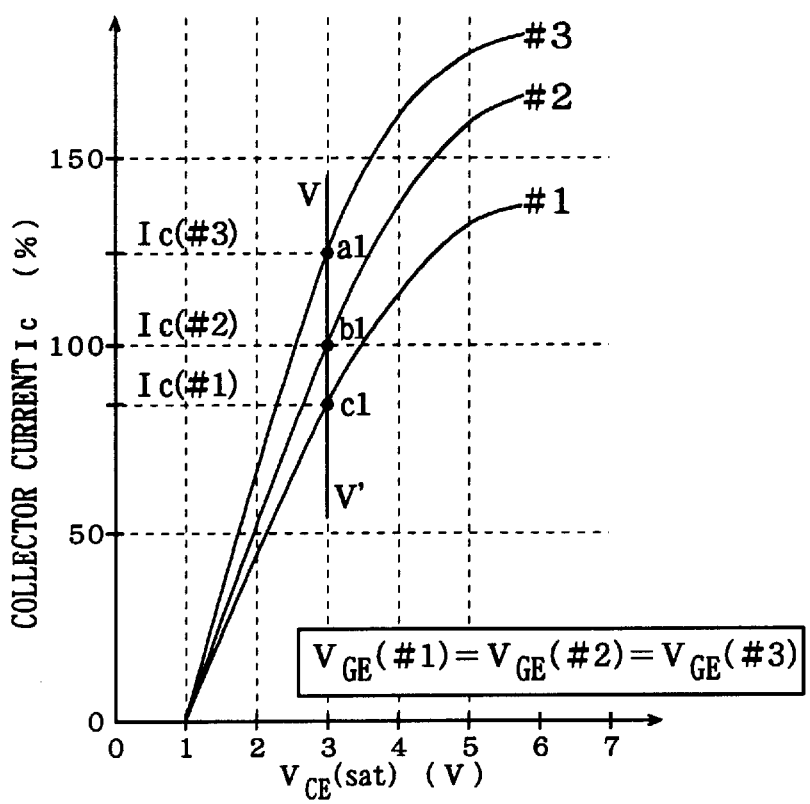
FIG. 9 is a graph illustrating inequality in output characteristics of three IGBTs.
Figure 10:
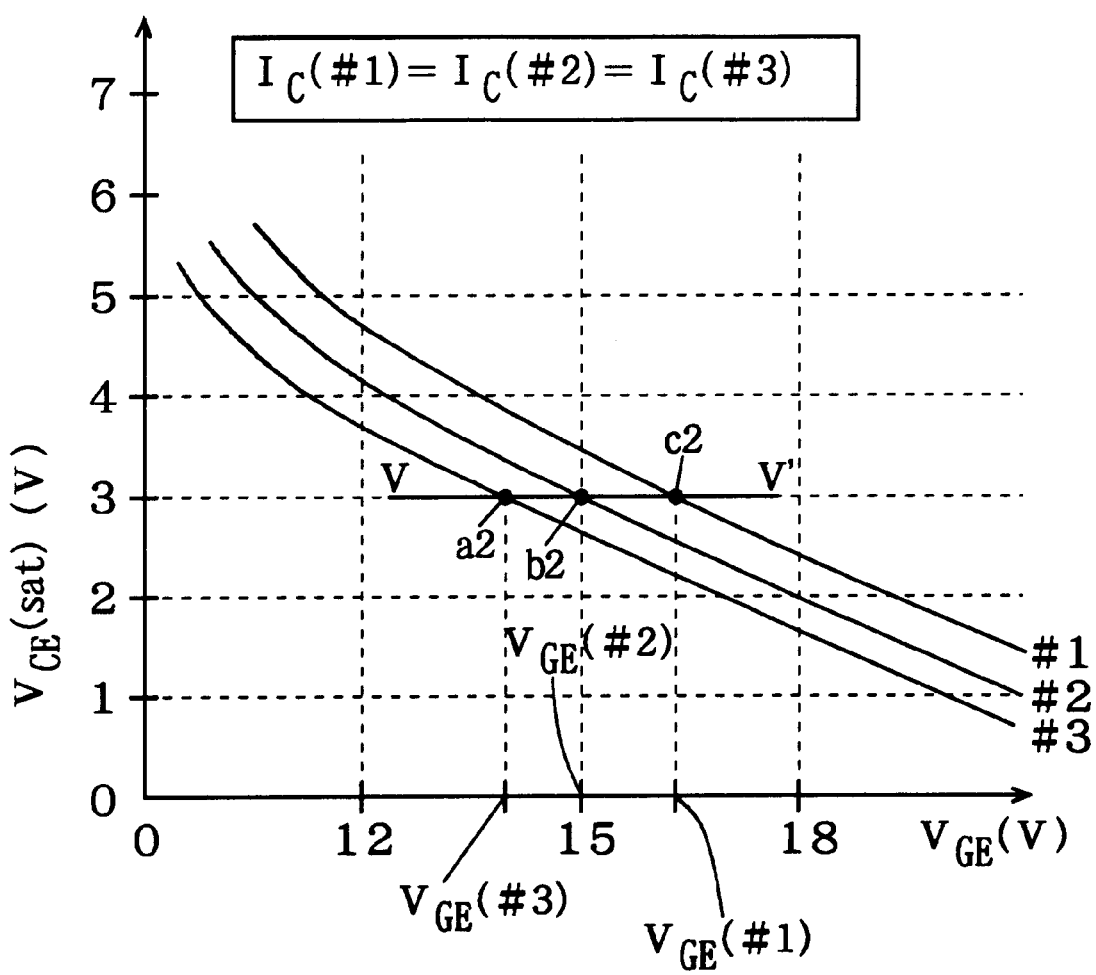
FIG. 10 is a graph illustrating inequality in transfer characteristics of three IGBTs.

This operation is described further in detail by referring to FIGS. 9 and 10. FIG. 9 shows output characteristics of those three IGBT samples #1, #2, and #3 which are unequal with one another in their saturation voltages $V_{CE(sat)}$. FIG. 10 shows transfer characteristics of the three samples #1, #2, and #3 under a constant collector current $I_C$ i.e. respective relations between saturation voltages $V_{CE(sat)}$ and gate voltages $V_{GE}$.

When the three samples #1, #2, and #3 are connected in parallel, these samples operate under a common saturation voltage $V_{CE(sat)}$ as shown by a linear segment V-V' in FIGS. 9 and 10. Therefore, if the same gate voltage $V_{GE}$ is supplied to the three samples #1, #2, and #3, different collector currents respectively defined by dynamic points a1, b1, and c1 in FIG. 9 flow across the samples #1, #2, and #3.

Specifically, collector currents $I_C$(#1), $I_C$(#2), and $I_C$(#3) respectively flow across the samples #1, #2, and #3 under the same gate voltage $V_{GE}$. Thus, a state of unequal collector currents $I_C$ flowing i.e. current imbalance emerges. As a result, the sample #3, across which the largest collector current $I_C$ flows, suffers high current stress.

On the other hand, FIG. 10 illustrates an operation that equal collector currents $I_C$ flow across the three samples #1, #2, and #3 and thereby desirable state of current balance is achieved when the samples #1, #2, and #3 are respectively driven at gate voltages $V_{GE}$(#1), $V_{GE}$(#2), and $V_{GE}$(#3) defined by dynamic points a2, b2, and c2 which are different with one another. Thus, the operation unit 53 calculates adequate gate voltages $V_{GE}$(#1), $V_{GE}$(#2), and $V_{GE}$(#3) to thereby implement current balance. The drive control voltages $V_{Dl}$-$V_{Dn}$, which are calculated by the operation unit 53, subjected to D/A conversion, and thereafter amplified and outputted from the drive control device 50, respectively correspond to the gate voltages $V_{GE}$ of the switching elements $80_l$-$80_l$.

<1-4. Details of Processing in Operation Unit>

Now, the operation processing executed by the operation unit 53 will be described in detail. The operation unit 53 includes a CPU typically being a microprocessor and a memory storing a program which defines an operation procedure of the CPU. The operation unit 53, thereby, executes a characteristic operation processing. However, it is also possible to form the operation unit 53 only of hardware elements any one of which does not need a program.

Figure 11:
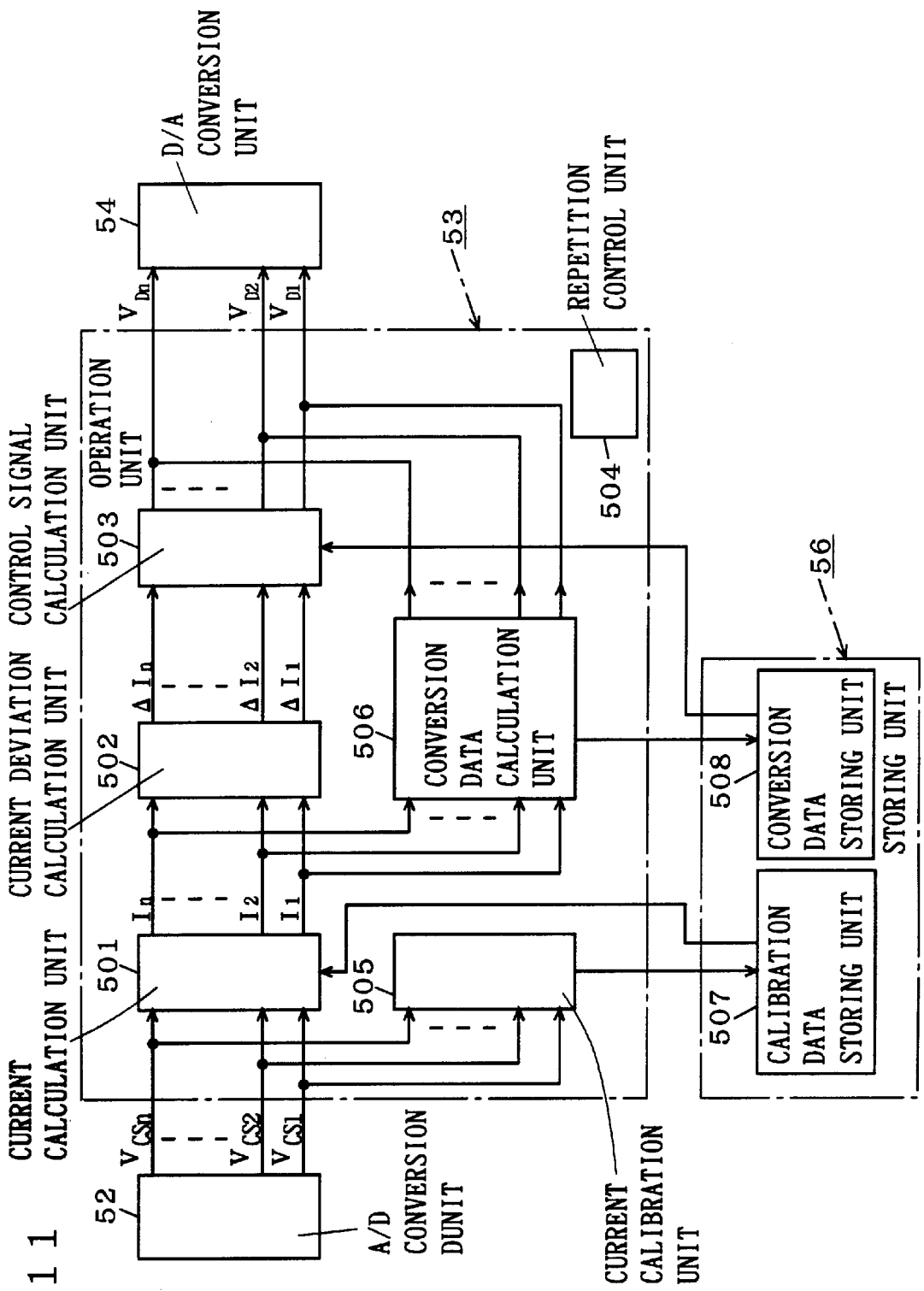
FIG. 11 is a block diagram of an operation unit of the first preferred embodiment.

FIG. 11 is a block diagram showing a preferable example of a characteristic portion in an internal structure of the operation unit 53 as formed of hardware elements requiring no program. FIG. 11 can also be regarded as a function diagram which equivalently represents a characteristic function of the operation unit 53 formed of the CPU and the memory. As shown in FIG. 11, the operation unit 53 equivalently comprises a current calculation unit 501, a current deviation calculation unit 502, a control signal calculation unit 503, a repetition control unit 504, a current calibration unit 505, and a conversion data calculation unit 506.

The current calculation unit 501 calculates collector currents $I_l$-$I_n$ of the switching elements $80_l$-$80_n$ on the basis of the current sense voltages $V_{CSl}$-$V_{CSn}$. The current calculation unit 501 refers to a calibration data stored by the calibration data storing unit 507 included in the storing unit 56 during the calculation. The calibration data, which is used for converting the current sense voltages $V_{CSl}$-$V_{CSn}$ respectively into the collector currents $I_l$-$I_n$, is created by the current calibration unit 505 and thereafter stored into the calibration data storing unit 507 prior to the normal use of the combined module 250.

The current deviation calculation unit 502 calculates current deviations $\Delta I_l$-$\Delta I_n$ on the basis of the collector currents $I_l$-$I_n$ obtained by the current calculation unit 501. The current deviations $\Delta I_l$-$\Delta I_n$ respectively correspond to the deviations of the collector currents $I_l$-$I_n$ from an average thereof.

The control signal calculation unit 503 so calculates the drive control voltages $V_{Dl}$-$V_{Dn}$ as to reduce the current deviations $\Delta I_l$-$\Delta I_n$ on the basis of the current deviations $\Delta I_l$-$\Delta I_n$ outputted by the current deviation calculation unit 502. The control signal calculation unit 503 refers to a conversion data stored by the conversion data storing unit 508 included in the storing unit 56 during the calculation. The conversion data, which defines respective relations between the current deviations $\Delta I_l$-$\Delta I_n$ and changes in the driving control voltages $V_{Dl}$-$V_{Dn}$, is created by the conversion data calculation unit 506 and stored into the conversion data storing unit 508 prior to the normal use of the combined module 250.

The current calculation unit 501, the current deviation calculation unit 502, and the control signal calculation unit 503 repeatedly execute respective operation processing when the combined module 250 is normally used. The repetition control unit 504 controls these repeated operations.

Figure 12:
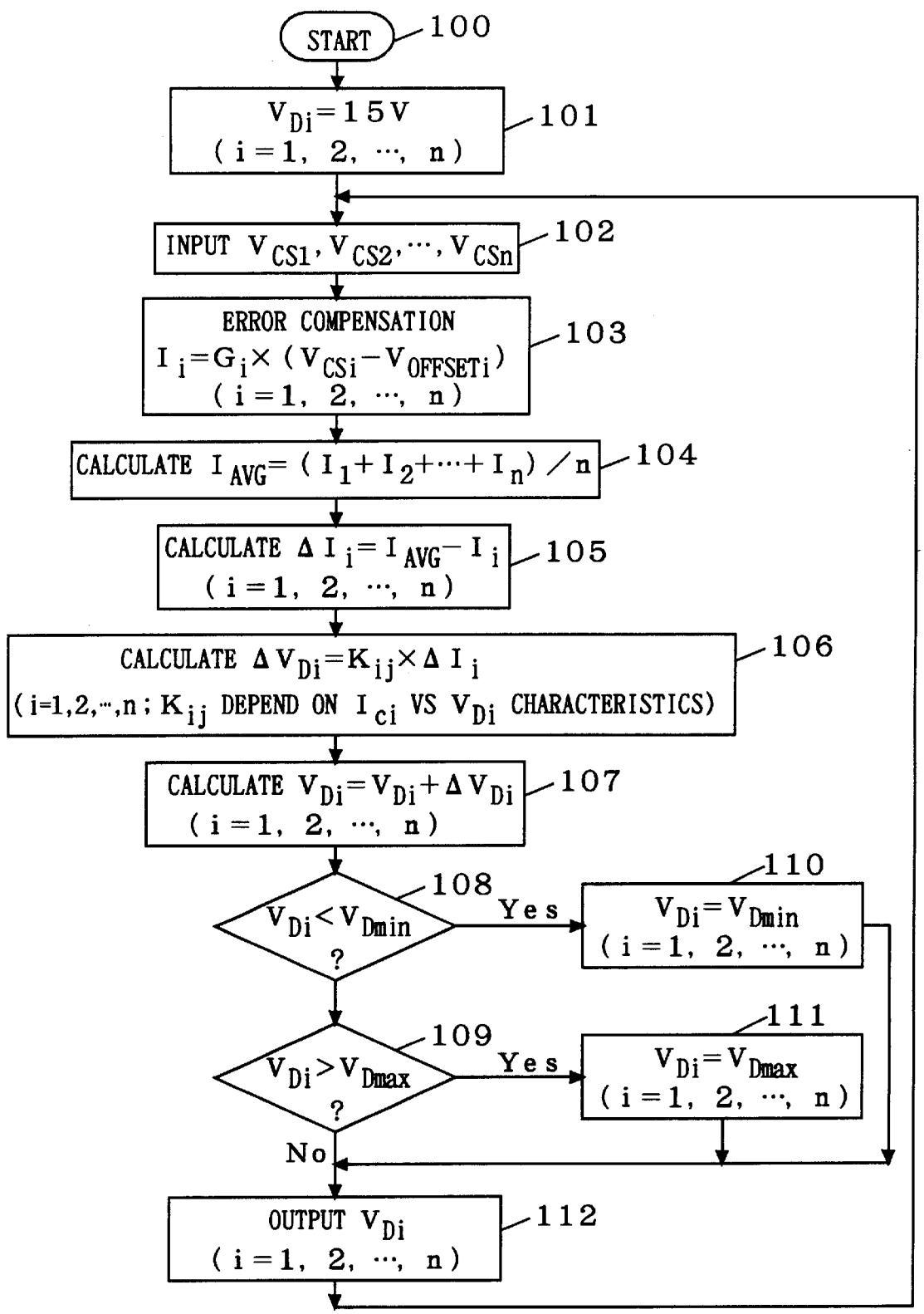
FIG. 12 is a flow chart showing a procedure of the operation of the operation unit of the first preferred embodiment.

FIG. 12 is a flow chart showing a procedure of the processing executed by the operation unit 53. After the processing is started (at a step 100), the drive control voltages $V_{Dl}$-$V_{Dn}$ are set at a common default value (i.e. an initial value) at a step 101. This processing is performed by the control signal calculation unit 503. The default value is, for example, 15 V. Accordingly, the gate voltages $V_{GE}$ of the switching elements $80_l$-$80_n$ are all set at 15 V for example at this step.

Subsequently, the current sense voltages $V_{CSl}$-$V_{CSn}$ are inputted at a step 102. The current sense voltages $V_{CSl}$-$V_{CSn}$ respectively correspond to the detected values of the collector currents $I_l$-$I_n$ as the n gate voltages $V_{GE}$ are given at the default value. Thereafter, the collector currents $I_1$–$I_n$ are calculated on the basis of the current sense voltages $V_{CS1}$–$V_{CSn}$ at a step 103.

Figure 13:
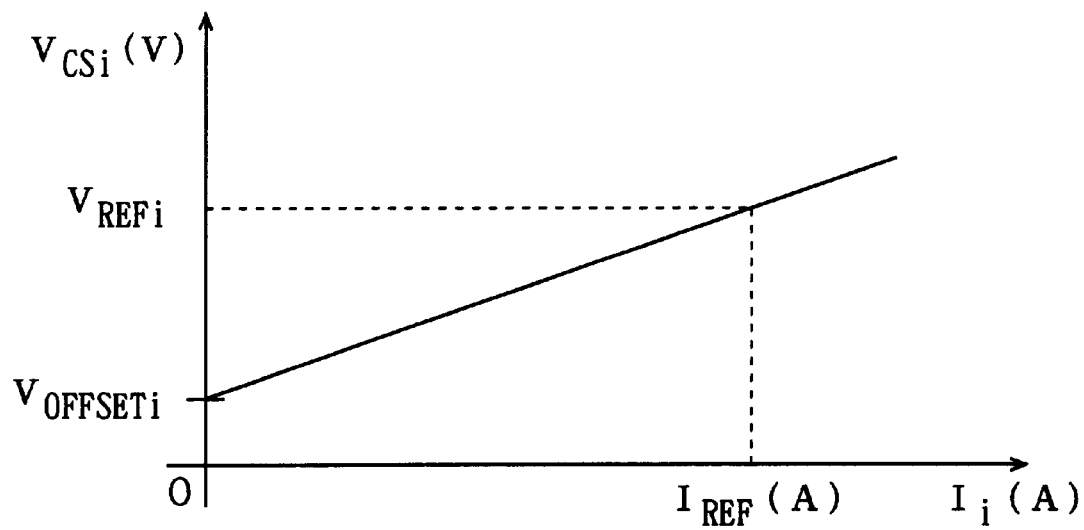
FIG. 13 is a graph showing a relation between a collector current $I_i$ and a current sense voltage $V_{CSi}$ of the first preferred embodiment.

The calibration data stored by the calibration data storing unit 507 is used during the calculation at the step 103. When a relation between the collector current $I_i$ and the current sense voltage $V_{CSi}$ for each switching element $80_i$ is expressed by a first-degree function (i.e. a linear relationship) as shown in FIG. 13, two constants e.g. an offset voltage $V_{OFFSETi}$ and a scaling coefficient $G_i$, which represents gradient of the line, are selected as the calibration data. As will be mentioned later, the calibration data is so prepared as to individually define respective relations between the current sense voltages $V_{CS1}$–$V_{CSn}$ and the collector currents $I_1$–$I_n$; i.e. the calibration data generally depends on the switching elements $80_1$–$80_n$.

When the offset voltage $V_{OFFSETi}$ and the scaling coefficient $G_i$ are selected as the calibration data, the collector current $I_i$ is given by:

$$I_i = G_i \times (V_{CSi} - V_{OFFSETi}) \tag{Eq. 1}$$

The operation processing from the step 102 to 103 is executed by the current calculation unit 501.

Then, an average current $I_{AVG}$, which is an average of the collector currents $I_1$–$I_n$, is calculated at a step 104. The average current $I_{AVG}$ is calculated through an operation based on a simple average calculation procedure i.e.:

$$I_{AVG} = (I_1 + I_2 + \ldots I_n)/n \tag{Eq. 2}$$

Thereafter, the current deviations $\Delta I_1$–$\Delta I_n$ are calculated at a step 105. The current deviation $\Delta I_i$ is calculated on the basis of:

$$\Delta I_i = I_{AVG} - I_i \tag{Eq. 3}$$

The operation procedure from the step 104 to 105 is executed by the current deviation calculation unit 502.

Subsequently, drive control voltage changes $\Delta V_{D1}$–$\Delta V_{Dn}$ which are to be added to the present values of the drive control voltages $V_{D1}$–$V_{Dn}$ on the basis of the current deviations $\Delta I_1$–$\Delta I_n$ at a step 106. Each drive control voltage change $\Delta V$ corresponds to difference between a new value to be obtained by renewing (i.e. updating) the drive control voltage $V_{Di}$ and the present value thereof; i.e. it corresponds to a change in the drive control voltage $V_{Di}$ given by the renewal. The drive control voltage change $\Delta V_{Di}$ is so calculated as to reduce the current deviation $\Delta I_i$.

The conversion data stored by the conversion data storing unit 508 is used during the calculation at the step 106. A multiplication factor $K_{ij}$, which corresponds to a change rate in a curve defining a relation between the collector current $I_i$ and the drive control voltage $V_{Di}$, is selected as the conversion data, for example. As will be described later, the multiplication factors $K_{i1}$, $K_{i2}$, $K_{i3}$, … $K_{21}$, … are prepared individually for respective switching elements $80_1$–$80_n$ and also for the respective drive control voltages $V_{Di1}$, $VD_{Di2}$, $V_{Di3}$, … for any one switching element $80_i$.

Accordingly, when the multiplication factors $K_{i1}$, $K_{i2}$, $K_{i3}$, … $K_{21}$, … are selected as the conversion data, the drive control voltage change $\Delta V_{Di}$ is calculated using a multiplication factor $K_{ij}$ corresponding to the value $V_{Dij}$ which is the nearest to the present value of the drive control voltage $V_{Di}$ on the basis of:

$$\Delta V_{Di} = K_{ij} \times \Delta I_i \tag{Eq. 4}$$

Subsequently, a new value of the drive control voltage $V_{Di}$ is calculated as a renewed value thereof at a step 107.

The renewed value of the drive control voltage $V_{Di}$ is calculated on the basis of:

$$V_{Di}(\text{renewed value}) = V_{Di}(\text{present value}) + \Delta V_{Di} \tag{Eq. 5}$$

Then, the drive control voltage $V_{Di}$ as a renewed value is so restricted as not to exceed a range from a predetermined lower limit $V_{Dmin}$ to a predetermined upper limit $V_{Dmax}$ through a step 108 to 111. More specifically, when the drive control voltage $V_{Di}$ calculated at the step 107 is lower than the lower limit $V_{Dmin}$, the drive control voltage $V_{Di}$ is replaced with the lower limit $V_{Dmin}$. On the other hand, when the drive control voltage $V_{Di}$ calculated at the step 107 is higher than the upper limit $V_{Dmax}$, the drive control voltage $V_{Di}$ is replaced with the upper limit $V_{Dmax}$.

Thereafter, the drive control voltages $V_{D1}$–$V_{Dn}$ are outputted as final and definite renewed values at a step 112. The operation processing from the step 106 to 111 is executed by the control signal calculation unit 503. After the processing at the step 112 is completed, the operation processing returns to the step 102. Thus, the processing from the step 102 to 112 is repeatedly executed. During the repetition, the current calculation unit 501, the current deviation calculation unit 502, and the control signal calculation unit 503 repeatedly perform respective operation procedures. The timing of the operation procedures repeatedly performed by these units are controlled by the repetition control unit 504.

Since the operation unit 53 handles digital signals as described above, the control for eliminating the current imbalance especially that arising from inequality in the saturation voltages $V_{CE(sat)}$ of the switching elements connected in parallel can be achieved in high precision. In addition, the current imbalance is eliminated, and thereby, the concentration of excessive load onto a particular switching element is prevented not only for switching elements having positive temperature coefficient such as NPT-IGBT (non-punch-through IGBT) i.e. those having self-control characteristic but also for those having negative temperature coefficient such as PT-IGBT (punch-through IGBT). In the switching elements having positive temperature coefficient, as a temperature increases, the saturation voltage $V_{CE(sat)}$ increases and thereby increase in the collector current $I_C$ is suppressed. On the other hand, in those having negative temperature coefficient, as a temperature increases, the saturation voltage $V_{CE(sat)}$ decreases and thereby the collector current $I_C$ increases, which gives rise to further temperature increase.

Especially, the calibration data and the conversion data are so prepared as to depend on the switching elements $80_1$–$80_n$ and prepared by taking account of inequality in characteristics of the current detection units $90_1$–$90_n$, the drive units $70_1$–$70_n$, and wires connected with the modules $60_1$–$60_n$ as will be described later. The control for eliminating the current imbalance, therefore, is implemented further in high precision.

<1-5. Preparation of Calibration Data>

Figure 14:
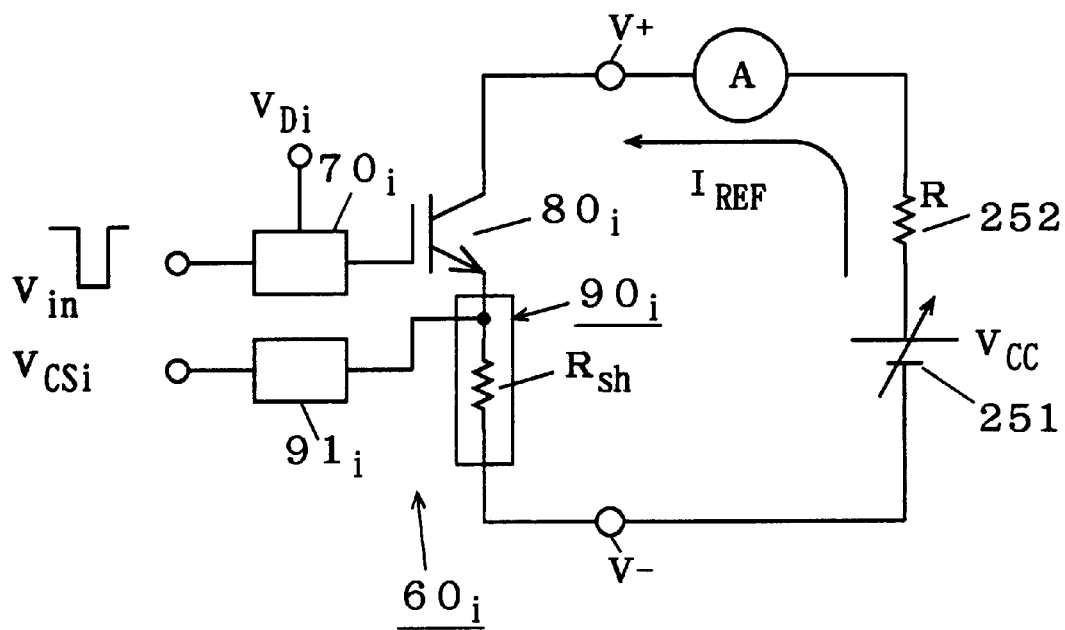
FIG. 14 is a circuit diagram showing an external device for preparing a calibration data.

The procedure for preparation of the calibration data carried out prior to use (i.e. normal operation) of the combined module 250 will be described in the following. External device for calibration is connected with the modules $60_1$–$60_n$ one by one in order to prepare the calibration data as shown in a circuit diagram of FIG. 14. In FIG. 14, a series circuit as the external device for calibration, which includes a power source 251, a resistance element 252, and an ammeter 253 connected in series with one another, is connected with the load terminal $V_+$ and the load terminal $V_{31}$.

The switching element $80_i$ turns on when receiving the input signal $V_{IN}$ at active level. The gate voltage $V_{GE(i)}$ of the switching element $80_i$ is identical with the drive control voltage $V_{Di}$, and the collector current $I_i$ flows in response to the drive control voltage $V_{Di}$ during ON state. The collector current $I_i$ also depends on a source voltage $V_{CC}$ supplied by the power source 251.

The collector current $I_i$ indicated by the ammeter 253 is set at (one or several) predetermined reference current(s) $I_{REF}$ by adjusting the source voltage $V_{CC}$. Based on the current sense voltage $V_{CSi}$ obtained thereby, the calibration data related to the module $60_i$ is created by the operation unit 53 and thereafter stored into the calibration data storing unit 507. This procedure is performed for each of the modules $60_1$–$60_n$.

Figure 15:
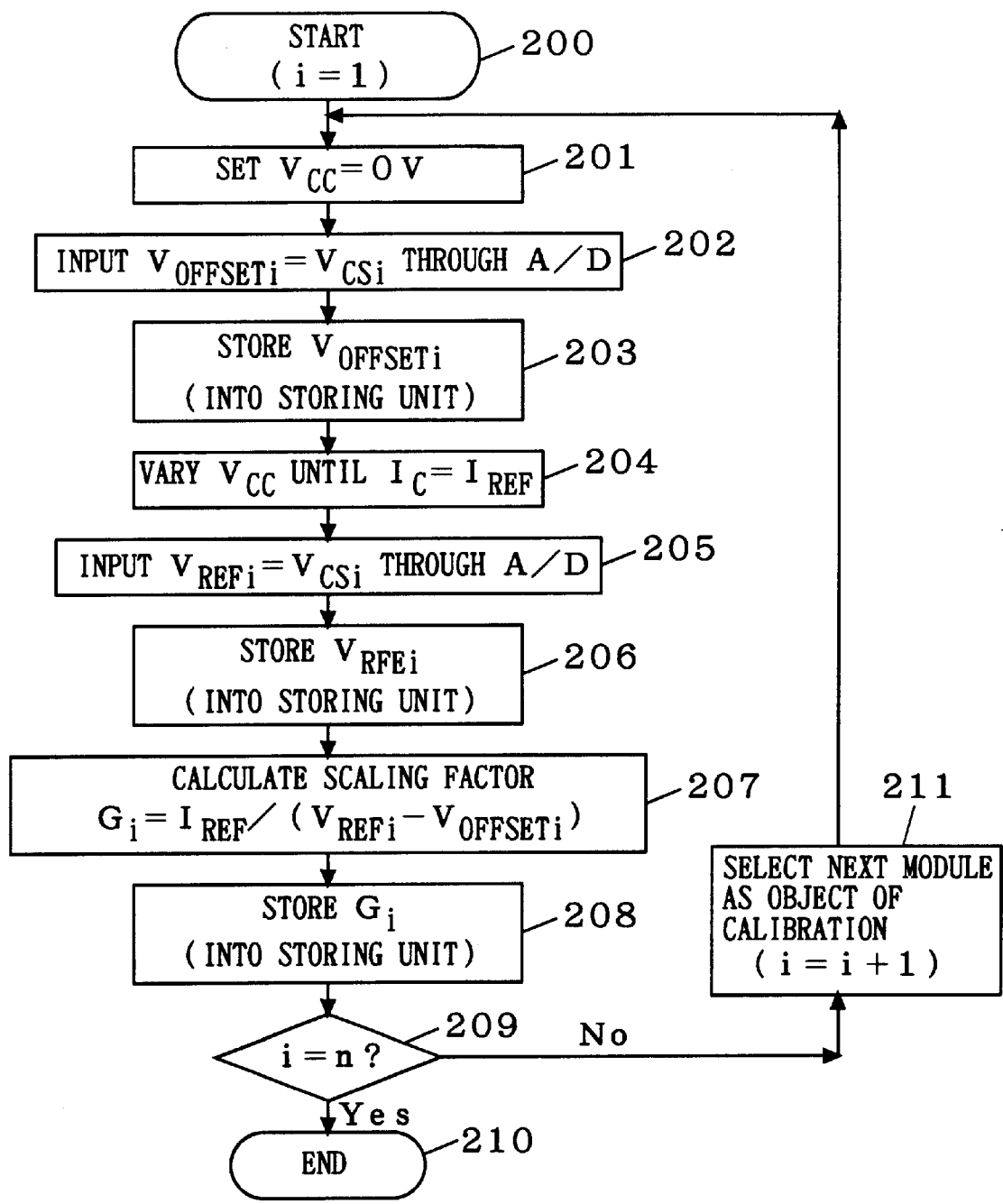
FIG. 15 is a flow chart showing a procedure of the operation of a current calibration unit of the first preferred embodiment.

The procedure of creating the calibration data is shown in the flow chart of FIG. 15 in more detail. After the processing is started at a step 200, the module $60_i$, which is an object of the calibration, is set to the module $60_i$; i.e. a variable i is set as i =1. The external device for the calibration shown in FIG. 14 is connected with the module $60_i$ by an operator (who usually does not belong to manufacturers but to users of the combined module 250) during the step 200.

Thereafter, the source voltage $V_{CC}$ is set at 0V by the operator operating the power source 251 (at a step 201). Then, the current sense voltage $V_{CSi}$ is inputted to the operation unit 53 (at a step 202). This current sense voltage $V_{CSi}$ corresponds to the offset voltage $V_{OFFSETi}$ shown in FIG. 13. Subsequently, the current sense voltage $V_{CSi}$ inputted to the operation unit 53 is stored into the calibration data storing unit 507 as the offset voltage $V_{OFFSETi}$ (at a step 203). The processing at the step 203 is performed by the current calibration unit 505.

Thereafter, the source voltage $V_{CC}$ is adjusted by the operator operating the power source 251 so that the collector current $I_i$ coincides with the predetermined reference current $I_{REF}$. Then, the current sense voltage $V_{CSi}$ is inputted to the operation unit 53 (at a step 205). This current sense voltage $V_{CSi}$ corresponds to the reference voltage $V_{REFi}$ shown in FIG. 13. Thereafter, the current sense voltage $V_{CSi}$ is stored into the calibration data storing unit 507 as the reference voltage $V_{REFi}$ (at a step 206). The processing at the step 206 is also performed by the current calibration unit 505.

Subsequently, the current calibration unit 505 calculates the scaling coefficient $G_i$ on the basis of the offset voltage $V_{OFFSETi}$ and the reference voltage $V_{REFi}$ which are stored by the calibration data storing unit 507 and the predetermined reference current $I_{REF}$ (at a step 207). The scaling coefficient $G_i$ is calculated by:

$$G_i = I_{REF}/(V_{REFi} - V_{OFFSETi}) \quad \text{(Eq. 6).}$$

The calculated scaling coefficient $G_i$ is stored into the calibration data storing unit 507 by the current calibration unit 505 (at a step 208). Thus, the calibration data storing unit 507 stores the offset voltage $V_{OFFSETi}$ and the reference voltage $V_{REFi}$ as the calibration data related to the module $60_i$.

Then, it is judged at a step 209 whether the variable i coincides with the number n of the modules $60_1$–$60_n$ or not. If the variable i is smaller than the number n; i.e. the calibration data is not obtained yet for all of the modules $60_1$–$60_n$, the processing moves onto a step 211 and the variable i is incremented by 1. Namely, another module $60_i$ is selected as an object of the calibration. Thereafter, the processing returns to the step 201. On the contrary, if the variable i is equal to the number n; i.e. the calibration data is already obtained for all of the modules $60_1$–$60_n$, the processing is completed (at a step 210).

The calibration data is obtained individually for the respective modules $60_1$–$60_n$ as described above. In addition, the calibration data reflects not only inequality in the characteristics of the current detection units $90_1$–$90_n$, e.g. inequality in the resistance of the resistance element Rsh but also inequality in the characteristics of the wires connected with the modules $60_1$–$60_n$ arising from laying-out of the same.

Errors in the units included in the drive control device 50 such as the A/D conversion unit 52 are also reflected in the calibration data. Accordingly, it is possible to carry out the control for eliminating the current imbalance in high precision taking account of such various inequalities or errors. Since two-point-calibration method is used, the control taking account of the offset voltage $V_{OFFESTi}$ is implemented in an example shown in the flow chart of FIG. 15. This also contributes to the highly precise control.

Since the operation unit 53 handles digital signals, and especially comprises the memory storing a program and the CPU for operating on the basis of the program, such a complicated control taking account of aforementioned various inequalities and errors and even using two-point-calibration method is readily accomplished. That is, flexible control reflecting various errors is easily implemented.

Whereas an example using two-point-calibration method, where a number k of the reference currents $I_{REF}$ is set as k =2, is shown in the flow chart of FIG. 15, k (more than two i.e. k≧3)-point-calibration method can also be employed. Besides, one-point-calibration method (i.e. method with k =1) can also be used when the offset voltage $V_{OFFSETi}$ is as low as negligible. In the one-point-calibration method, only the scaling coefficients $G_1$, ..., $G_n$, for example, are calculated without calculation of $V_{OFFSET1}$, ..., $V_{OFFSETn}$ and thereafter stored into the calibration data storing unit 507.

<1-6. Preparation of Conversion Data>

Figure 16:
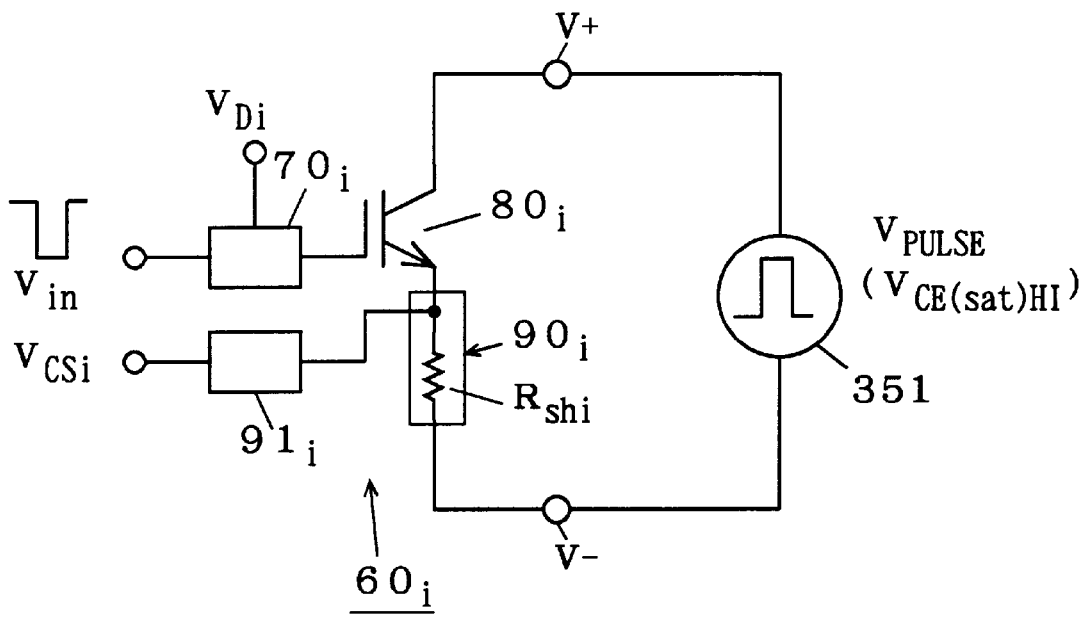
FIG. 16 is a circuit diagram showing an external device for preparing a conversion data.

The procedure for preparing the conversion data carried out together with the aforementioned preparation of the calibration data prior to use (i.e. normal operation) of the combined module 250 will be described in the following. External device for measurement is connected with the modules $60_1$–$60_n$ one by one in order to prepare the conversion data as shown in a circuit diagram of FIG. 16. In FIG. 16 a power source 351 as the external device for measurement is connected with the load terminal $V_+$ and the load terminal $V_-$ of the module $60_i$.

The switching element $80_i$ turns on when receiving the input signal $V_{IN}$ at active level. Since the gate voltage $V_{GE(i)}$ of the switching element $80_i$ is identical with the drive control voltage $V_{Di}$, the collector current $I_i$ flows in response to the drive control voltage $V_{Di}$ during ON state. The collector current $I_i$ also depends on a source voltage $V_{PULSE}$ supplied by the power source 351. Since the power source 351 is directly connected with the load terminals $V_+$, and $V_{31}$ without resistance element and so on as a load interposed therebetween, the power source 351 generates the source voltage $V_{PULSE}$ in such pulses as not to bring a damage to the switching element $80_i$.

Since the power source 351 is directly connected with the load terminals $V_+$, and $V_{31}$, the source voltage $V_{PULSE}$ coincides with the saturation voltage $V_{CE(sat)}$ when the switching element $80_i$ is in an ON state. The voltage drop across the resistance element Rsh is negligible compared with the source voltage $V_{PULSE}$. The source voltage $V_{PULSE}$ is adjusted by operating the power source 351. The conversion data related to the module $60_i$ is created in the operation unit 53 on the basis of the current sense voltages $V_{CSi}$ obtained for various values of drive control voltage $V_{Di}$ and thereafter stored into the conversion data storing unit 508. This procedure is performed for each of the modules $60_1$–$60_n$.

Figure 17:
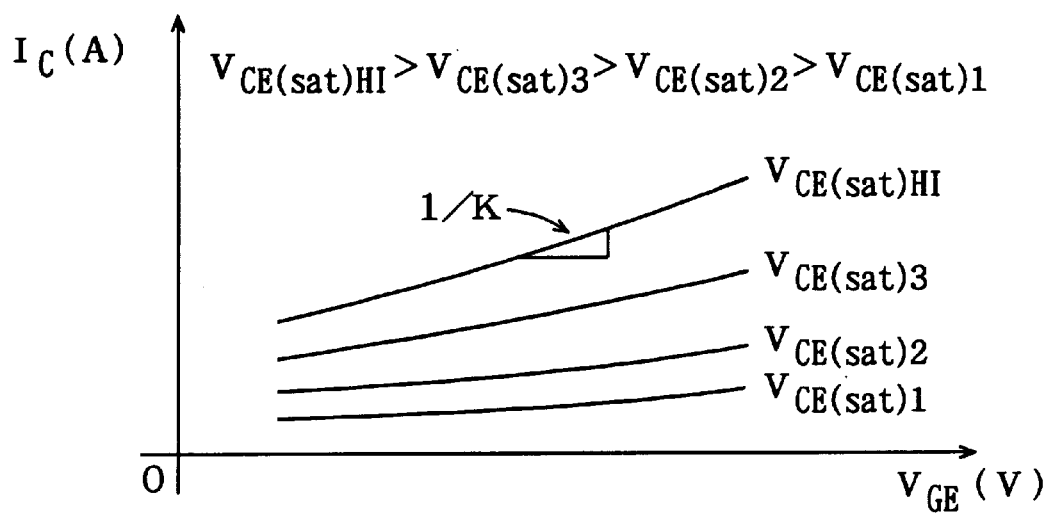
FIG. 17 is a graph illustrating a transfer characteristic of an IGBT.

FIG. 17 is a graph showing a transfer characteristic for one of the switching elements $80_1$–$80_n$ i.e. a relation between a gate voltage $V_{GE}$ and a collector current $I_C$ under various saturation voltages $V_{CE(sat)}$. The collector current $I_C$ increases with an increase in the gate voltage $V_{GE}$ under a constant saturation voltage $V_{CE(sat)}$. Besides, the collector current $I_C$ increases with an increase in the saturation voltage $V_{CE(sat)}$ under the gate voltage $V_{GE}$.

A gradient i.e. a change rate of a curve of the collector current $I_C$ versus the gate voltage $V_{GE}$ increases with an increase in the saturation voltage $V_{CE(sat)}$. The multiplication factor K is defined by the reciprocal of this change rate. Therefore, the multiplication factor K decreases with an increase in the saturation voltage $V_{CE(sat)}$. The multiplication factor K is employed as the conversion data as shown in FIG. 12.

The operation unit 53 can not recognize the actual saturation voltage $V_{CE(sat)}$ which varies from moment to moment depending on operating condition when the combined module 250 is used. That is, the saturation voltage $V_{CE(sat)}$ is not fed back. In general, it is, therefore, impossible for the operation unit 53 to eliminate the current imbalance in a single step i.e. only by calculating the drive control voltage $V_{Di}$ once. Accordingly, a predetermined value is employed as the multiplication factor K, and the loop shown in FIG. 12 is repeated a number of times so that the elimination of the current imbalance is achieved.

If the multiplication factor $K_i$ for the module $60_i$ is large, the drive control voltage change $\Delta V_{Di}$ is calculated as a large value for the current deviation $\Delta I_i$ calculated. As a result, there is a possibility that the current deviation $\Delta I_i$ largely fluctuates between positive and negative values. It is, therefore, desirable that the multiplication factor $K_i$ is suppressed as small as the current deviation $\Delta I_i$ is not reversed in its sign and converges to zero.

As is clear from FIG. 17, when the multiplication factor $K_i$ obtained under the highest saturation voltage $V_{CE(sat)HI}$ within a range where the module $60_i$ is operable e.g. under the maximum rated value of the saturation voltage $V_{CE(sat)}$ is employed as the conversion data, there is no possibility that the current deviation $\Delta I_i$ largely fluctuates, and there is no possibility that the multiplication factor $K_i$ is set smaller than necessary. Namely, it is possible for the current deviation $\Delta I_i$ to converge into zero rapidly and smoothly. Further, even if the saturation voltage $V_{CE(sat)}$ is common among the modules $60_1$–$60_n$, the multiplication factors $K_i$ are not necessarily the same. It is, therefore, further desirable that the multiplication factors $K_i$ are calculated individually for the respective modules $60_1$–$60_n$. The operation unit 53 calculates the conversion data with such the most desirable method.

Figure 18:
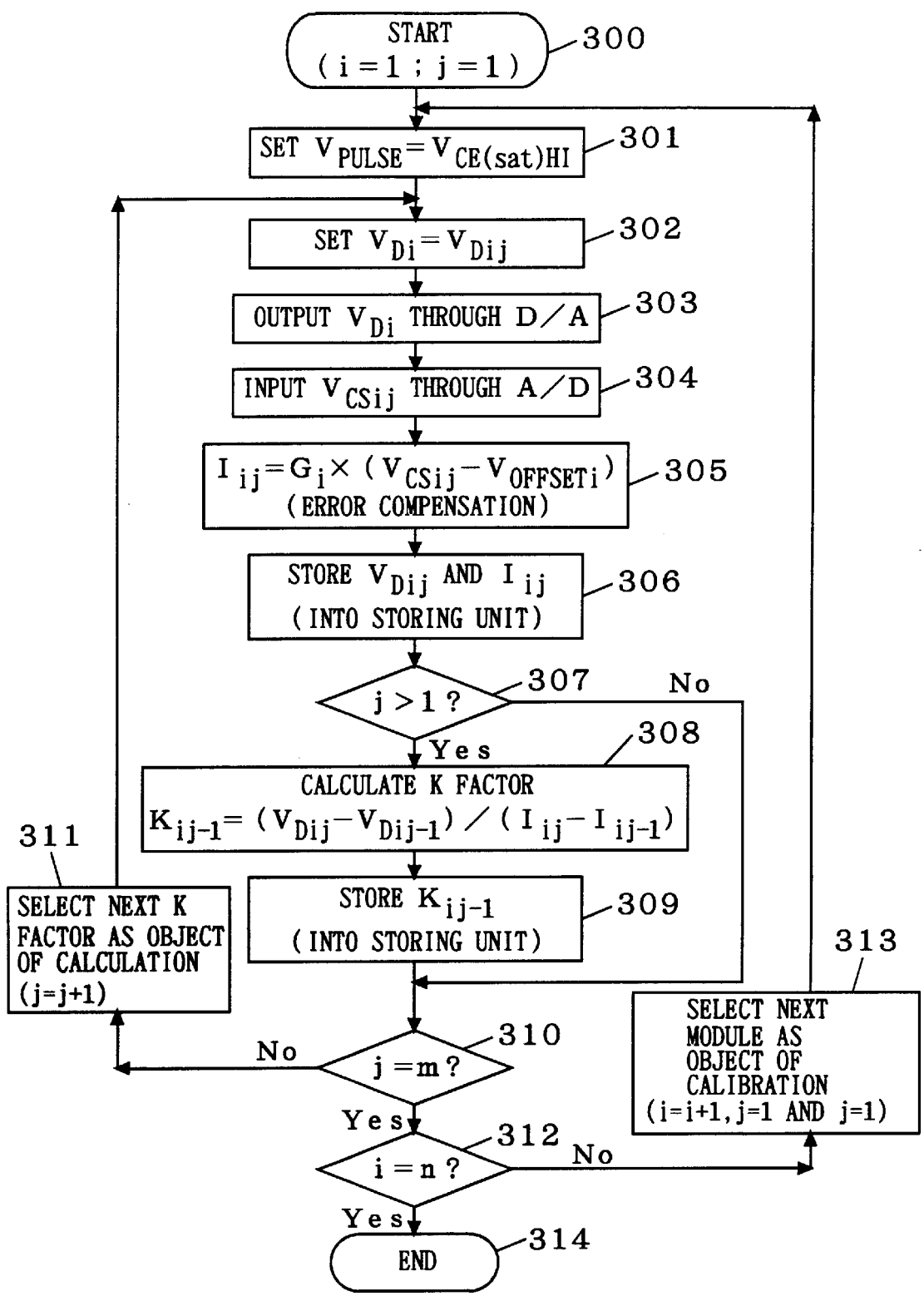
FIG. 18 is a flow chart showing a procedure of the operation of a conversion data calculation unit of the first preferred embodiment.

The procedure for preparing the conversion data is shown in a flow chart of FIG. 18 in more detail. After the processing is started at a step 300, the module $60_i$, which is an object of the calculation, is set to the module $60_i$; i.e. a variable i is set as i =1. The power source 351 for the calculation shown in FIG. 16 is connected with the module $60_i$ by the operator during the step 200. Further, a variable j, which identifies one from another among plural values of the drive control voltage $V_{Di}$, is set to the initial value "1."

Thereafter, the source voltage $V_{PULSE}$ is set at the predetermined saturation voltage $V_{CE(sat)HI}$ by the operator operating the power source 351 (at a step 301). The predetermined saturation voltage $V_{CE(sat)HI}$, for example, corresponds to the maximum rated value of the saturation voltage $V_{CE(sat)}$ of the switching elements $80_1$–$80_n$. Subsequently, the drive control voltage $V_{Di}$ is set at a predetermined value of the drive control voltage $V_{Dij}$ (at a step 302) and outputted through the D/A converter unit 54 (at a step 303). As a result, the same value as the drive control voltage $V_{Dij}$ is inputted to the gate electrode of the switching elements $80_i$ as the gate voltage $V_{GE(i)}$.

Thereafter, the current sense voltage $V_{CSij}$, which is the detected value of the collector current $I_i$ for the drive control voltage $V_{Dij}$, is inputted to the operation unit 53 (at a step 304). Then, the inputted current sense voltage $V_{CSij}$ is converted into the collector current $I_{ij}$ by the current calculation unit 501 (at a step 305). Thus, the current calculation unit 501 calculates the collector current $I_i$ by using the calibration data stored by the calibration data storing unit 507 not only when the combined module 250 is used (i.e. normally operates) but also during the creation of the conversion data performed prior to the use of the combined module 250.

Thereafter, the drive control voltage $V_{Dij}$ and the collector current $I_{ij}$ are stored into the conversion data storing unit 508 (at a step 306). This procedure of the step 306 is performed by the conversion data calculation unit 506. Then, it is judged at a step 307 whether the variable j is larger than 1 or not. If the variable j is 1; i.e. the conversion data storing unit 508 is storing only one group of the drive control voltage $V_{Dij}$ and the collector current $I_{ij}$ for the module $60_i$, the processing moves onto a step 310.

On the contrary, the variable j is larger than 1; i.e. the conversion data storing unit 508 is storing more than one group of the drive control voltage $V_{Dij}$ and the collector current $I_{ij}$ for the module $60_i$, the processing moves onto a step 308. The multiplication factor $K_{ij-1}$ is calculated on the basis of the latest and the next latest conversion data related to the module $60_i$ at the step 308. as:

$$K_{i,j-1}=(V_{Dij}-V_{Di,j-1})/(I_{ij}-I_{i,j-1}) \qquad (Eq.7).$$

Thereafter, the calculated multiplication factor $K_{ij-1}$ is stored into the conversion data storing unit 508 (at a step 309). The processing of the step 308 and 309 are executed by the conversion data calculation unit 506.

Subsequently, it is judged whether the variable j coincides with a predetermined constant m ($\geq 22$) or not at a step 310. If the variable j is smaller than the constant m; i.e. the calculation of not all the conversion data for the module $60_i$ is completed, the processing moves onto a step 311, and the variable j is incremented by one. That is, another drive control voltage $V_{Dij}$ is selected as an object of the calculation of the conversion data. Thereafter, the processing returns to the step 302. On the contrary, if the variable j is equal to the constant m; i.e. all the conversion data are obtained for the module $60_i$, the processing moves onto a step 312.

It is judged whether the variable i coincides with the number n of the nodules $60_1$–$60_n$ or not at the step 312. If the number i is smaller than the number n; i.e. the conversion data is not obtained yet for all the modules $60_1$–$60_n$,the processing moves onto a step 313, and the variable i is incremented by one and the variable j is reset to one. That is, another module $60_i$ is selected as an object of the calculation of the conversion data. Thereafter, the processing returns to the step 301. On the contrary, if the variable i coincides with the number n; i.e. the conversion data is obtained for all the modules $60_1$–$60_n$, the processing is completed (at a step 314).

As stated above, the multiplication factor $K_i$ is obtained for the highest saturation voltage $V_{CE(sat)HI}$ for respective modules $60_i$. Therefore, such a control is implemented as to rapidly converge the current deviation $\Delta I_i$ into zero suppressing the fluctuation of the same small. Further, the multiplication factors $K_i$ are obtained individually for the respective modules $60_1$~$60_n$.

In addition, not only the inequality in the transfer characteristics of the switching elements $80_1$~$80_n$, but also the inequality in the characteristics of the drive units $70_1$~$70_n$ and of the wires connected with the modules $60_1$~$60_n$ arising from laying-out of the same and so on are reflected in the multiplication factors $K_i$. Further, errors in the internal units of the drive control device 50 e.g. the D/A conversion unit 54 are reflected in the multiplication factors $K_i$ as well.

Accordingly, the control for eliminating the current imbalance can be implemented on the basis of an adequate conversion data taking account of such the various inequalities or errors stated above. Since the operation unit 53 handles the digital signals; especially comprises the memory storing the program and the CPU for operating in accordance with the program, such a complicated control taking account of the aforementioned various kinds of inequalities and errors is easily achieved. That is, a flexible control absorbing various causes of errors is easily implemented only with a simple structure.

The value independent of the drive control voltage $V_{Di}$ is obtained as the multiplication factor $K_i$ when the constant m shown in FIG. 18 is set at "2" which is the lower limit thereof. On the other hand, as the constant m is set larger, the multiplication factors $K_{ij}$ are obtained more in their number, and thereby, the control which reflects in higher precision the non-linearity of the relation shown in FIG.17 is implemented.

In an example shown in FIG. 18, the multiplication coefficients $K_{ij}$ themselves are stored into the conversion data storing unit 508, and the stored multiplication coefficients $K_{ij}$ are used in the operation processing at the step 106 of the FIG. 12. On the contrary, it is also possible that the multiplication factors $K_i(V_{GE})$ are calculated as functions varying smoothly with the gate voltage $V_{GE}$ by use of well known interpolation or extrapolation method on the basis of the multiplication coefficients $K_{ij}$(j=1~m) which are obtained from the repetition of the loop from the step 302 to 311 of FIG. 18 with the constant m set as m≦3, and thereby, the calculated multiplication factors $K_i(V_{GE})$ are stored into the conversion data storing unit 508. The control which reflects in further higher precision the non-linearity of the relation shown in FIG.17 can, thereby, be implemented.

<1-7. Corroborating Test>

Figure 19:
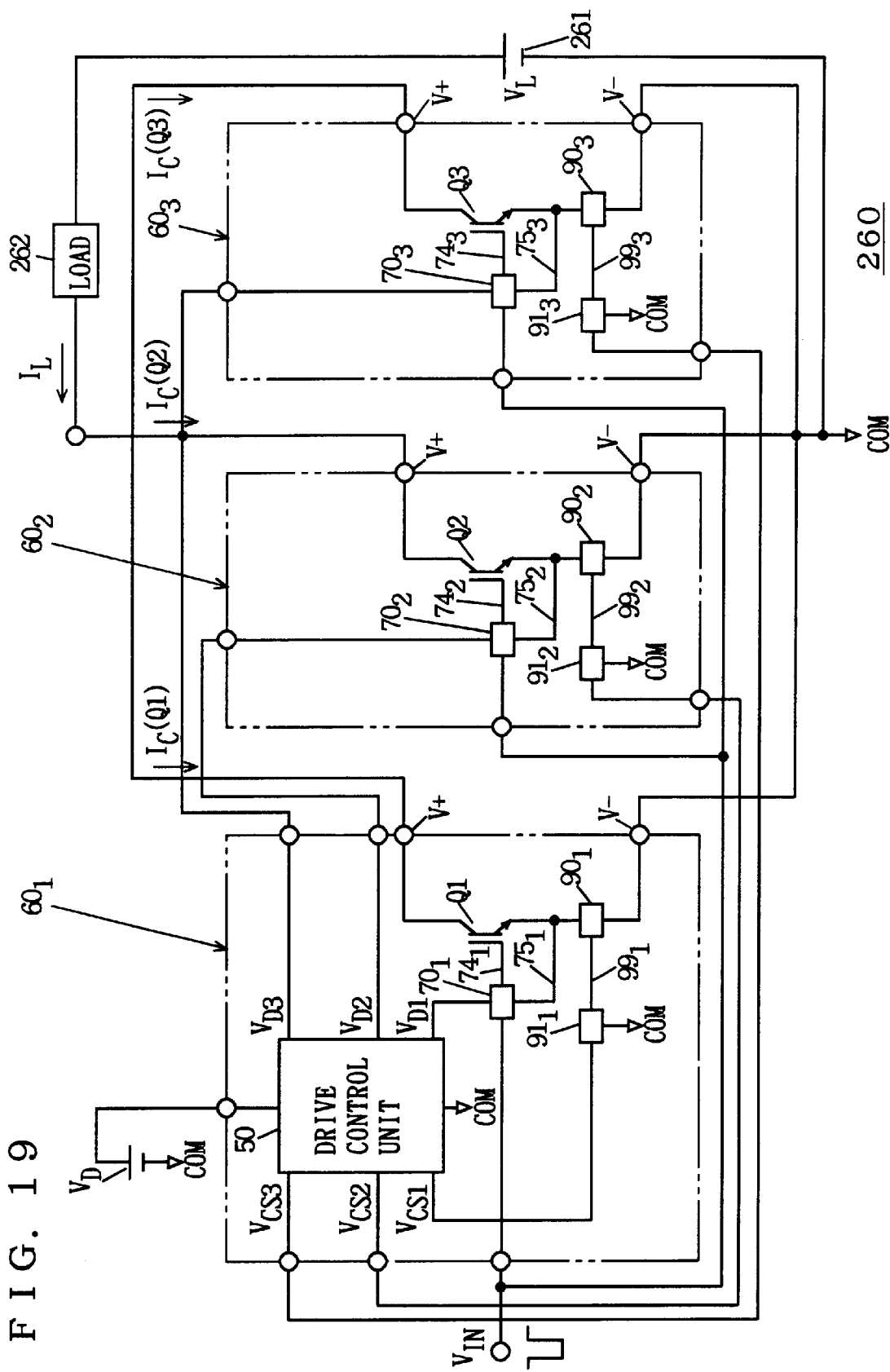
FIG. 19 is a block diagram of a combined module as an object of a simulation.

Now, the computer simulation conducted in order to prove the performance of the combined module 250 will be described. FIG. 19 is a block diagram showing a combined module selected as an object for the simulation. This combined module 260 is consistent with the combined module 250 shown in FIG. 1 with the number set at three. A series circuit comprising a load power source 261 and a load 262 connected in series with each other is connected with the load terminals $V_+$ and $V_{31}$ of the three modules $60_1$~$60_3$.

The switching elements respectively provided in the modules $60_1$~$60_3$ are IGBTs which have the same rated value and are respectively referred to as samples Q1, Q2, and Q3. The rated value of the collector currents $I_C$ (i.e. rated currents) of the samples Q1, Q2, and Q3 are each set at 100 A. The rated current of the combined module 260, therefore, amounts to 300 A. The rated values of the gate voltages $V_{GE}$ (i.e. rated gate voltages) of the samples Q1, Q2, and Q3 are each set at 15 V.

Figure 20:
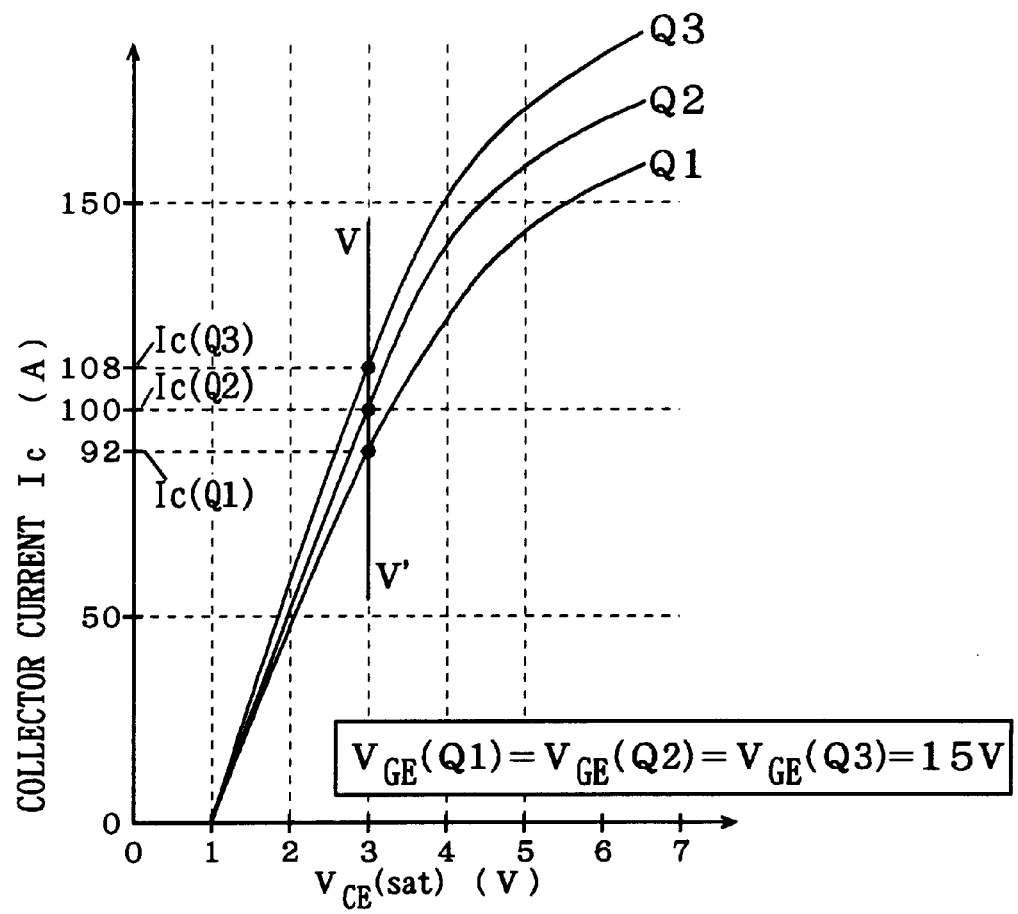
FIG. 20 is a graph showing an output characteristic of IGBTs in the combined module as an object of the simulation.

Further, the deviation of the saturation voltages $V_{CE(sat)}$ from their representative value 3.0 V are set at ±10% under the application of the rated gate voltage of 15 V as given by the output characteristics of the samples Q1, Q2, and Q3 shown in FIG. 20. Specifically, the deviations in the saturation voltages $V_{CE(sat)}$ are set at +10% for the sample Q1, 0% for the sample Q2, and −10% for the sample Q3.

Figure 21:
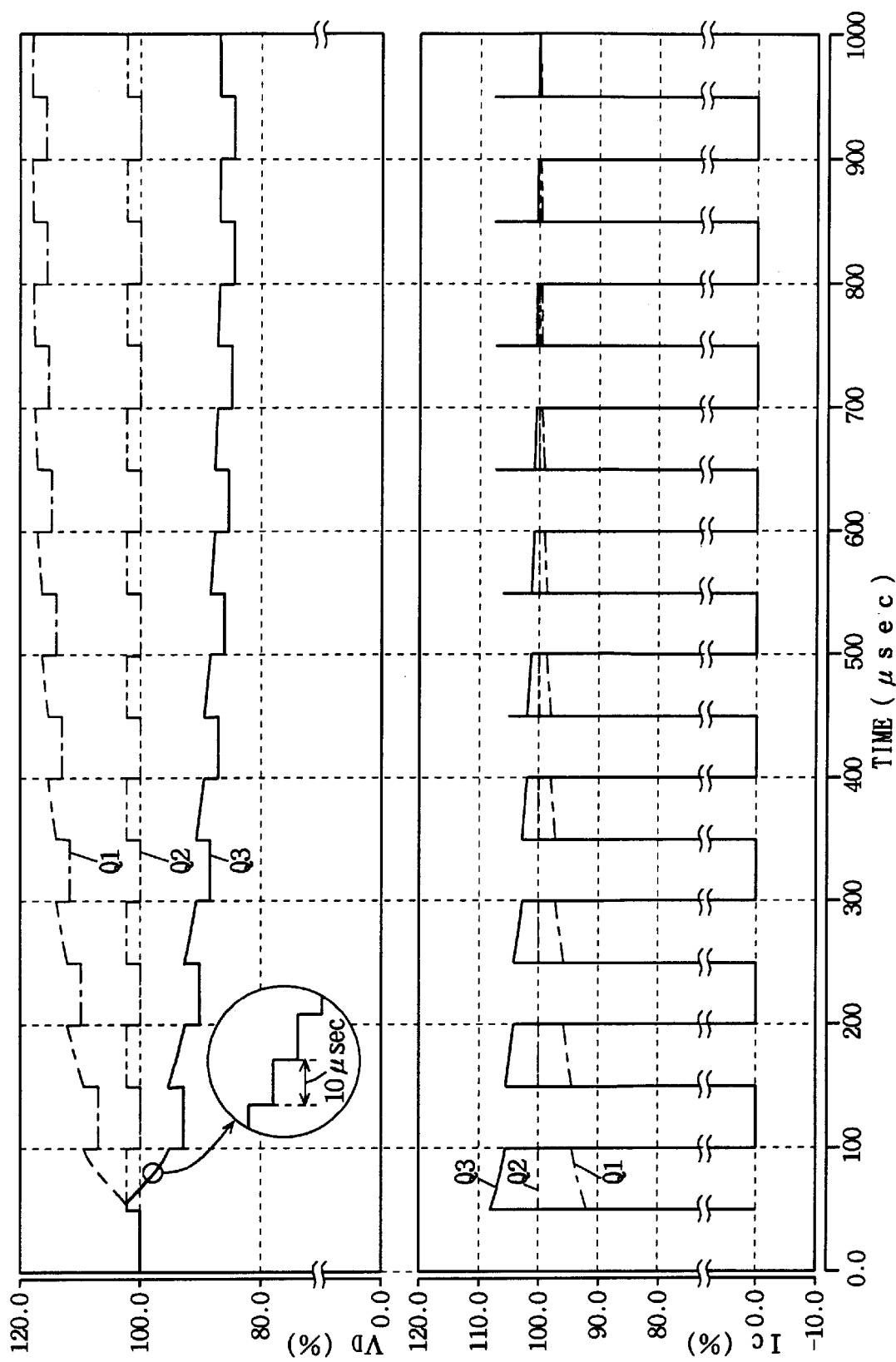
FIG. 21 is a graph showing a result of the simulation.

FIG. 21 is a graph showing the results of the simulation. The input signal $V_{IN}$ repeats its active and normal levels alternately in a period of 100 μsec. Accordingly, the samples Q1, Q2, and Q3 each repeat ON and OFF states alternately in a frequency of 10 kHz. Besides, the operation unit 53 (FIG.2) provided in the drive control device 50 repeatedly executes the loop shown in FIG. 12 in a period of 10 μsec.

As shown in FIG. 21, a default value of 15 V is inputted to each of the three samples Q1, Q2, and Q3 as the gate voltages $V_{GE}$ at the time when the operation is started (at the step 101 in FIG. 12). As a result, the rated current of 300 A of the combined module 260 is shared by the samples Q1, Q2, and Q3 with a current inequality of approximately ±8% at the beginning of the operation. This operation is clear from the graph of FIG. 20 as well. More specifically, the collector currents $I_C$ of the samples Q1, Q2, and Q3 respectively come to $I_C(Q1)$=108 A, $I_C(Q2)$=100 A, and $I_C(Q3)$=92 A.

The operation unit 53, by repeatedly executing the operation processing shown in FIG. 12, raises up the gate voltage $V_{GE}$ (which coincides with the drive control voltage $V_D$) so as to increase the collector current $I_C$ (Q1) which is smaller than the average of 100 A, pulls down the gate voltage $V_{GE}$ so as to decrease the collector current $I_C(Q3)$ which is larger than 100 A, and does not change the gate voltage $V_{GE}$ so as to hold the collector current $I_C(Q2)$ which coincides with 100 A.

As a result, the current imbalance of approximately ±8% present at the beginning of the operation is eliminated as early as 1 msec after, and the three samples Q1, Q2, and Q3 each come to share the rated value of 100 A equally with one another. Besides, the collector currents $I_C(Q1)$, $I_C(Q2)$, and $I_C(Q3)$ each do not suffer as large fluctuations as the signs thereof are reversed until the current imbalance is eliminated i.e. in a period from 0 to 1 msec. That is, the collector currents of the three samples Q1, Q2, and Q3 smoothly and rapidly converge into the same value. Thus, the expected performance is proved as a result of the simulation carried out using a computer for the combined module 260.

<1-8. Example of Application>

Figure 22:
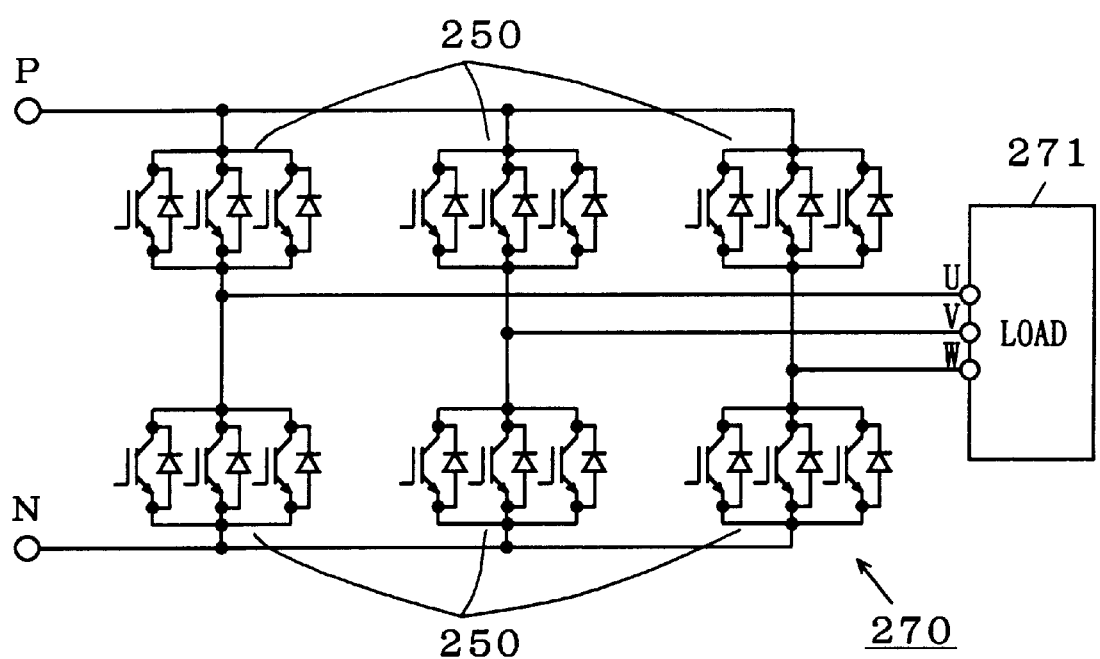
FIG. 22 is a circuit diagram illustrating a form of the utilization of the combined module.

Next, an example of the application of the combined module 250 will be described. The combined module 250 is well suited for being applied to a converter, a chopper, and an inverter, for example. FIG. 22 is a circuit diagram showing a relation between the combined modules 250 and a load in an inverter which is typical one of the applications. This inverter 270 has three series circuits each of which comprises the two combined modules 250 connected in series with each other. The three series circuits are interposed between dc power source lines P and N in parallel with one another. The connection point between each of the two combined series modules 250 is connected with the load 271.

An external device not shown in FIG. 22 is connected with each one of the six combined modules 250 and inputs the input signals $V_{IN}$ thereto. The input signals $V_{IN}$ are inputted to the two combined modules 250 so as to turn on and off the two alternately, and inputted to the three series circuits so as to keep operational phases thereof different by 120 degrees from one another. As a result, the load 271 is adequately driven.

Each of the six combined modules 250 shown in FIG. 22 is provided with three diodes respectively connected with the three switching elements. These diodes are provided in order to prevent the switching elements from being affected by reverse currents during their ON and OFF operations.

<2. Second Preferred Embodiment>

Figure 23:
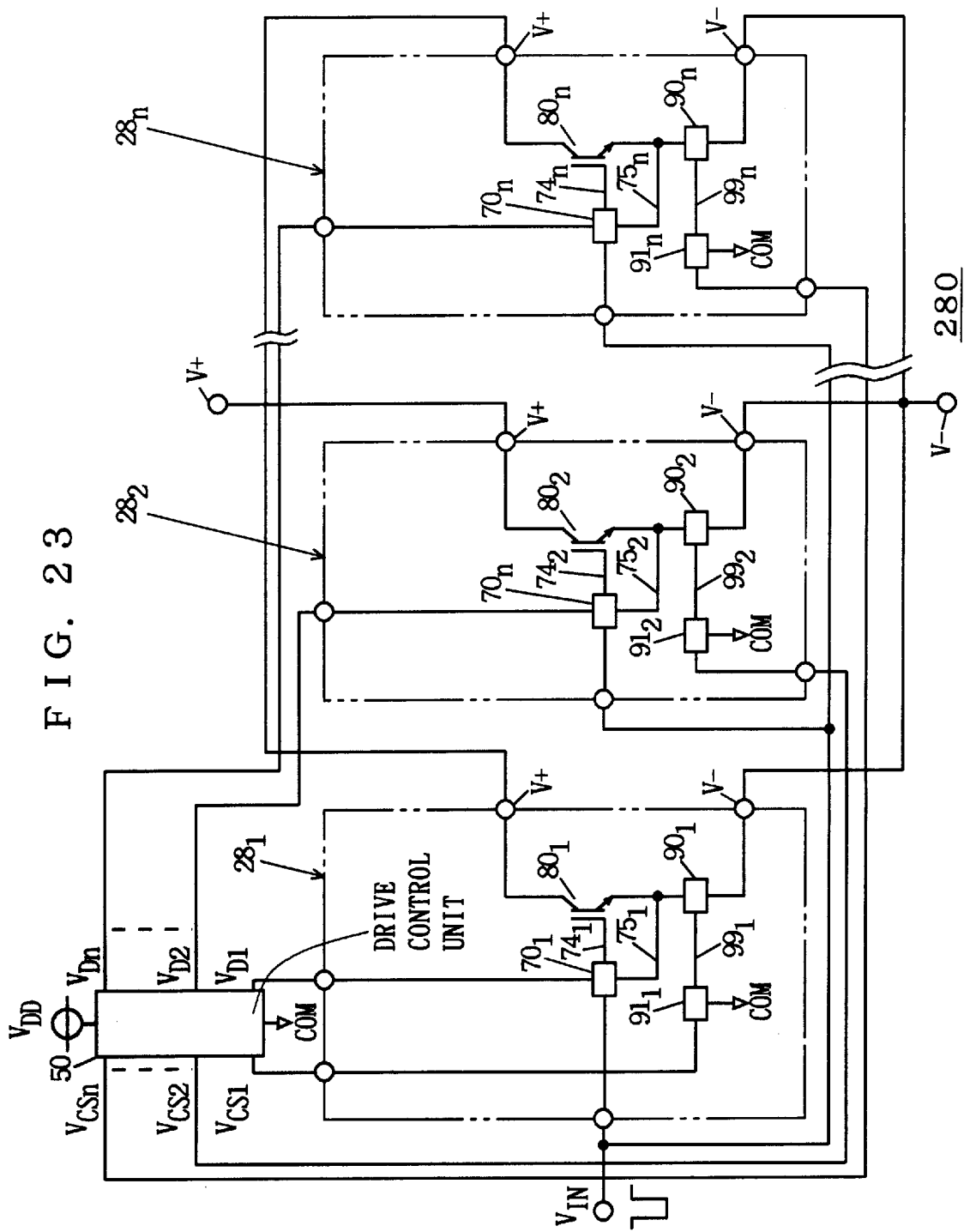
FIG. 23 is a block diagram of a combined module according to a second preferred embodiment of the present invention.

FIG. 1 showed an example where the drive control device 50 is integrated into the main module $60_1$ which is one of the modules $60_1$~$60_n$ connected in parallel with one another. The relation between the drive control device 50 and the plural modules connected in parallel with one another, however, is not restricted to the example shown in FIG. 1. FIG. 23 is a block diagram showing another example different from one shown in FIG. 1 in the relation between the drive control device 50 and the modules.

In this combined module, the drive control device 50 is separated from any one of the modules $28_1$~$28_n$. Each one of the modules $28_1$~$28_n$ is identical with any one of the sub-module $60_2$~$60_n$ shown in FIG. 1. The drive control device 50 operates in the combined module 280 similarly to the same in the combined module 250. Accordingly, the effects similar to those in the combined module 250 are obtained.

The combined module 250 is advantageous in that the handling thereof is easy when used, because the drive control device 50 is integrated into one of the modules. On the other hand, the combined module 280 is advantageous in that it is not needed to manufacture different two kinds i.e. the main module and the sub-module, but is possible to form the combined module only of the modules having the same structure, and thereby manufacturing cost can be reduced.

<3. Modifications>

The drive control device 50 was so formed as to be capable of creating the calibration data and the conversion data individually for respective modules connected in parallel with one another. However, it is also possible to form the drive control device 50 which employs a typical value (e.g. designed value) common among the modules connected in parallel as the calibration data and the conversion data even though the precision is degraded.

In this configuration, the operation unit 53 has to comprise neither the current calibration unit 505 nor the conversion data calculation unit 506. It is sufficient if the designed values defined by the rated values of the modules, with which the drive control device 50 is to be connected, are stored into the calibration data storing unit 507 and the conversion data storing unit 508 respectively as the calibration data and the conversion data by manufacturers in advance.

Also in this configuration, the control for eliminating the current imbalance is achieved in higher precision in comparison with those performed by conventional analogue circuits because the operation unit 53 handles the digital signals. The elimination of the current imbalance can be implemented even for the switching elements having the negative temperature characteristic.

While the invention has been shown and described in detail, the foregoing description is in all aspects illustrative and not restrictive. It is therefore understood that numerous modifications and variations can be devised without departing from the scope of the invention.

We claim:

1. A drive control device for being connected with n switching elements, where n is at least 2, which are connected in parallel with one another and for repeatedly renewing n control signals which control n main currents flowing across said n switching elements respectively by controlling drive voltages of said n switching elements on a basis of n current detection signals representing detected values of said n main currents and thereby supplying said n switching elements with said n control signals, comprising:

an A/D conversion unit for converting said n current detection signals from analogue form to digital form;

an operation unit for executing digital operation processing on a basis of said n current detecting signals having digital form to thereby calculate said n control signals; and a D/A conversion unit for converting said n control signals calculated by said operation unit from digital form to analogue form, said D/A conversion unit being coupled to n drive units for adjusting drive voltages applied respectively to said n switching elements on the basis of said n control signals;

said operation unit comprising:

a current calculation unit for converting said n current detection signals having digital form into said n main currents respectively;

a current deviation calculation unit for calculating an average of said n main currents and calculating n current deviations which are respectively differences of said n main currents from said average; and a control signal calculating unit for renewing said n control signals to reduce each of said n current deviations.

2. A drive control device for being connected with n switching elements, where n is at least 2, which are connected in parallel with one another and for repeatedly renewing n control signals which control n main currents flowing across said n switching elements respectively on a basis of n current detection signals representing detected values of said n main currents and thereby supplying said n switching elements with said n control signals, comprising:

an A/D conversion unit for converting said n current detection signals from analogue form to digital form;

an operation unit for executing digital operation processing on a basis of said n current detecting signals having digital form to thereby calculate said n control signals; and a D/A conversion unit for converting said n control signals calculated by said operation unit from digital form to analogue form;

said operation unit comprising:

a current calculation unit for converting said n current detection signals having digital form into said n main currents respectively;

a current deviation calculation unit for calculating an average of said n main currents and calculating n current deviations which are respectively differences of said n main currents from said average; and a control signal calculating unit for renewing said n control signals to reduce each of said n current deviations; and a calibration data storing unit for storing a calibration data which individually defines respective relations between said n current detection signals and said n main currents depending on said n switching elements, wherein said current calculation unit converts said n current detection signals into said n main currents respectively on a basis of said calibration data stored by said calibration data storing unit.

3. The drive control device of claim 2, wherein said operation unit further comprises:

a current calibration unit for creating said calibration data on a basis of k current detection signals, where is at least 1 responding to given k main currents for each of said n switching elements and thereby storing said created calibration data into said calibration data storing unit.

4. The drive control device of claim 3, wherein
said number k is set as k=2, and
said current calibration unit creates and stores into said calibration data storing unit those two constants as said calibration data which define a linear relationship between a main current and a current detection signal for each of said n switching elements.

5. A drive control device for being connected with n switching elements, where n is at least 2, which are connected in parallel with one another and for repeatedly renewing n control signals which control n main currents flowing across said n switching elements respectively on a basis of n current detection signals representing detected values of said n main currents and thereby supplying said n switching elements with said n control signals, comprising:
   an A/D conversion unit for converting said n current detection signals from analogue form to digital form;
   an operation unit for executing digital operation processing on a basis of said n current detecting signals having digital form to thereby calculate said n control signals; and
   a D/A conversion unit for converting said n control signals calculated by said operation unit from digital form to analogue form,
said operation unit comprising:
   a current calculation unit for converting said n current detection signals having digital form into said n main currents respectively;
   a current deviation calculation unit for calculating an average of said n main currents and calculating n current deviations which are respectively differences of said n main currents from said average; and
   a control signal calculating unit for renewing said n control signals to reduce each of said n current deviations;
   wherein said control signal calculation unit renews said n control signals to change the same by an amount respectively proportional to said n current deviations.

6. The drive control device of claim 5 further comprising:
a conversion data storing unit for storing a conversion data which individually defines respective proportional relations between said n current deviations and said n control signals depending on said n switching elements, wherein
   said control signal calculation unit so renews said n control signals as to change the same by an amount respectively proportional to said n current deviations on a basis of said conversion data stored by said conversion data storing unit.

7. The drive control device of claim 6, wherein
said operation unit further comprises:
   a conversion data calculation unit for outputting m control signals, where m is at least 2, to each of said n switching elements under an application of a common saturation voltage to said n switching elements, creating said conversion data for each of said n switching elements as change rate in main current versus control signal on a basis of said m control signals and m main currents obtained by said current calculation unit as a result of an output of said m control signals, and thereby storing said created conversion data into said conversion data storing unit.

8. The drive control device of claim 7, wherein
said conversion data storing unit is storing said conversion data which is created by said conversion data calculation unit under application of a maximum value of saturation voltages applicable to said n switching elements during operation.

9. The drive control device of claim 7, wherein
said number m is at least 3.

10. A drive control device for being connected with n switching elements, where n is at least 2, which are connected in parallel with one another and for repeatedly renewing n control signals which control n main currents flowing across said n switching elements respectively on a basis of n current detection signals representing detected values of said n main currents and thereby supplying said n switching elements with said n control signals, comprising:
   an A/D conversion unit for converting said n current detection signals from analogue form to digital form;
   an operation unit for executing digital operation processing on a basis of said n current detecting signals having digital form to thereby calculate said n control signals; and
   a D/A conversion unit for converting said n control signals calculated by said operation unit from digital form to analogue form,
said operation unit comprising:
   a current calculation unit for converting said n current detection signals having digital form into said n main currents respectively;
   a current deviation calculation unit for calculating an average of said n main currents and calculating n current deviations which are respectively differences of said n main currents from said average; and
   a control signal calculating unit for renewing said n control signals to reduce each of said n current deviations,
   wherein said operation unit has a CPU for operating in accordance with a program and a memory storing said program, and
   said units provided in said operation unit are equivalently formed of said CPU and said memory.

11. A module, comprising:
a drive control device for being connected with n switching elements, where n is at least 2 which are connected in parallel with one another and for repeatedly renewing n control signals which control n main currents flowing across said n switching elements respectively on a basis of n current detection signals representing detected values of said n main currents and thereby supplying said n switching elements with said n control signals,
said drive control device comprising:
   an A/D conversion unit for converting said n current detection signals from analogue form to digital form;
   an operation unit for executing digital operation processing on a basis of said n current detection signals having digital form to thereby calculate said n control signals; and
   a D/A conversion unit for converting said n control signals calculated by said operation unit from digital form to analogue form,
said operation unit comprising:
   a current calculation unit for converting said n current detection signals having digital form into said n main currents respectively;
   a current deviation calculation unit for calculating an average of said n main currents converted into by said current calculation unit and thereby calculating n current deviations which are respectively differences of said n main currents from said average; and a control signal calculating unit for renewing said n control signals so as to reduce each of said n current deviations, said module further comprising:
  a main element as one of said n switching elements; and
  a current detection unit for detecting a main current flowing across said main element and thereby outputting a current detection signal, said drive control device receiving said current detection signal outputted by said current detection unit as one of said n current detection signals, and said drive control device supplying said main element with one of said n control signals.

12. A combined module, comprising:

a drive control device for being connected with n switching elements, where n is at least 2 which are connected in parallel with one another and for repeatedly renewing n control signals which control n main currents flowing across said n switching elements respectively on a basis of n current detection signals representing detected values of said n main currents and thereby supplying said n switching elements with said n control signals, said drive control device comprising:
  an A/D conversion unit for converting said n current detection signals from analogue form to digital form;
  an operation unit for executing digital operation processing on a basis of said n current detection signals having digital form to thereby calculate said n control signals; and
  a D/A conversion unit for converting said n control signals calculated by said operation unit from digital form to analogue form, said operation unit comprising:
  a current calculation unit for converting said n current detection signals having digital form into said n main currents respectively;
  a current deviation calculation unit for calculating an average of said n main currents converted into by said current calculation unit and thereby calculating n current deviations which are respectively differences of said n main currents from said average; and
  a control signal calculating unit for renewing said n control signals so as to reduce each of said n current deviations, said combined module further comprising:
  said n switching elements; and
  n current detection units for detecting said n main currents to thereby respectively obtain said n current detection signals and supplying said drive control device with said n current detection signals, and said drive control device supplying said n switching elements with said n control signals respectively.

13. The combined module of claim 12, wherein said combined module further comprises n cases, said n switching elements and said n current detection units are integrated into said n cases respectively, and any one of said n current detection units detects a main current of one of said n switching elements which is integrated into one case with the same.

14. The combined module of claim 13, wherein said drive control device is also integrated into one of said n cases.

* * * * *

UNITED STATES PATENT AND TRADEMARK OFFICE
CERTIFICATE OF CORRECTION

PATENT NO. : 6,208,041 B1
DATED : March 27, 2001
INVENTOR(S) : Gourab Majumdar, et al.

It is certified that error appears in the above-identified patent and that said Letters Patent is hereby corrected as shown below:

Column 1,
Line 56, insert -- a -- before "more serious".

Column 9,
Line 38, change "are" to -- is -- before "connected".

Column 10,
Line 4, change "~$90_l$ to -- ~$90_n$ -- before ". Any";
Line 57, insert -- the -- before "manufacturing".

Column 11,
Line 64, change "~$80_l$" to -- ~$80_n$ --.

Column 13,
Line 42, change "$_\Delta V$corresponds" to -- $_\Delta V_{Di}$ corresponds --;
Line 54, change "$K_{l1}$, $K_{l2}$, $K_{l3}$," to -- $K_{11}$, $K_{12}$, $K_{13}$, -- after "factors";
Lines 58-59, change "$K_{l1}$, $K_{l2}$, $K_{l3}$," to -- $K_{11}$, $K_{12}$, $K_{13}$, --.

Column 14,
Line 14, change "$V_{d1}$" to -- $V_{D1}$ -- after "voltages";
Line 65, change "$V_{31}$" to -- $V_-$ --.

Column 16,
Line 51, change "V31" to -- $V_-$ -- before "without";
Line 56, change "V31" to -- $V_-$ -- before "the".

Column 18,
Line 31, change "$K_{ij\text{-}l}$" to -- $K_{ij\text{-}1}$ -- after "factor";
Line 33, change "308." to -- 308 -- after "at the step";
Line 36, change "$K_{ij\text{-}1}$" to -- $K_{ij\text{-}1}$ --;
Line 41, change "22" to -- 2-- after "m($\geq$";
Line 55, change "$60_n$,the" to -- $60_n$, the -- after "$60_1$~".

Column 19,
Line 55, change "$V_{31}$" to -- $V_-$ -- after "$V_+$ and".

UNITED STATES PATENT AND TRADEMARK OFFICE
CERTIFICATE OF CORRECTION

PATENT NO. : 6,208,041 B1
DATED : March 27, 2001
INVENTOR(S) : Gourab Majumdar, et al.

It is certified that error appears in the above-identified patent and that said Letters Patent is hereby corrected as shown below:

<u>Column 24,</u>
Line 44, change "2which" to -- 2, which -- after "is at least".

<u>Column 25,</u>
Line 19, change "2which" to -- 2, which -- after "is at least".

Signed and Sealed this

Thirteenth Day of November, 2001

Attest:

*Nicholas P. Godici*

NICHOLAS P. GODICI
*Attesting Officer*     *Acting Director of the United States Patent and Trademark Office*